US012592267B2

(12) United States Patent
Kalitsov et al.

(10) Patent No.: US 12,592,267 B2
(45) Date of Patent: Mar. 31, 2026

(54) MAGNETORESISTIVE MEMORY DEVICE AND METHOD OF OPERATING SAME USING PHASE CONTROLLED MAGNETIC ANISOTROPY

(71) Applicant: SANDISK TECHNOLOGIES LLC, Addison, TX (US)

(72) Inventors: Alan Kalitsov, San Jose, CA (US); Derek Stewart, Livermore, CA (US); Bhagwati Prasad, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 656 days.

(21) Appl. No.: 18/048,121

(22) Filed: Oct. 20, 2022

(65) Prior Publication Data

US 2023/0307029 A1 Sep. 28, 2023

Related U.S. Application Data

(63) Continuation-in-part of application No. 17/656,310, filed on Mar. 24, 2022, now Pat. No. 12,211,535.

(51) Int. Cl.
| | |
|---|---|
| *G11C 11/16* | (2006.01) |
| *H10B 61/00* | (2023.01) |
| *H10N 50/80* | (2023.01) |
| *H10N 50/85* | (2023.01) |

(52) U.S. Cl.
CPC ........ *G11C 11/161* (2013.01); *G11C 11/1673* (2013.01); *G11C 11/1675* (2013.01); *H10B 61/00* (2023.02); *H10N 50/80* (2023.02); *H10N 50/85* (2023.02)

(58) Field of Classification Search
CPC .................................................. G11C 11/1673
See application file for complete search history.

(56) References Cited

U.S. PATENT DOCUMENTS

| | | | |
|---|---|---|---|
| 9,564,152 B2 * | 2/2017 | Ohno | ..................... H10N 50/10 |
| 10,788,547 B2 | 9/2020 | Kalitsov et al. | |
| 10,937,809 B1 | 3/2021 | Sharangpani et al. | |
| 10,964,748 B1 | 3/2021 | Prasad et al. | |
| 10,991,407 B1 | 4/2021 | Prasad et al. | |
| 11,005,034 B1 | 5/2021 | Prasad et al. | |
| 11,024,648 B2 | 6/2021 | Sharangpani et al. | |

(Continued)

OTHER PUBLICATIONS

Homm "Room temperature Mott insulator transition in V2O3 compounds induced via strain-engineering" (Year: 2021).*
Lou, J. et al., "Giant Electric Field Tuning of Magnetism in Novel Multiferroic FeGaB/Lead Zinc Niobate-Lead Titanate (PZN-PT) Heterostructures," *Advanced Materials*, vol. 21, pp. 4711-4715, (2009); doi:10.1002/adma.200901131.

(Continued)

*Primary Examiner* — Douglas King
(74) *Attorney, Agent, or Firm* — THE MARBURY LAW GROUP PLLC

(57) ABSTRACT
A magnetoresistive memory cell includes a first terminal electrode, a second terminal electrode, and a magnetoresistive layer stack located between the first terminal electrode and the second terminal electrode and including, from one side to another, a reference layer, a dielectric tunnel barrier layer, a free layer, and a material layer having two different states of lattice deformation which have different average in-plane lattice constants and which are configured to apply different in-plane stress. The material layer may be a metal-insulator transition (MIT) material layer that exhibits a phase transition between an insulator state and a metal state.

20 Claims, 9 Drawing Sheets

(56) References Cited

U.S. PATENT DOCUMENTS

| | | | |
|---|---|---|---|
| 11,049,538 B2 | 6/2021 | Kalitsov et al. | |
| 11,056,640 B2 | 7/2021 | Prasad et al. | |
| 11,069,741 B2 | 7/2021 | Prasad et al. | |
| 11,152,048 B1 | 10/2021 | Prasad et al. | |
| 11,200,934 B2 | 12/2021 | Prasad et al. | |
| 11,417,379 B2 | 8/2022 | Kalitsov et al. | |
| 2004/0257849 A1 | 12/2004 | Jeong | |
| 2006/0011958 A1 | 1/2006 | Jeong et al. | |
| 2014/0247653 A1 | 9/2014 | Wang et al. | |
| 2015/0041934 A1 | 2/2015 | Khvalkovskiy et al. | |
| 2016/0049582 A1* | 2/2016 | Kim | G11C 13/0007 |
| | | | 257/4 |
| 2017/0179373 A1 | 6/2017 | Swerts et al. | |
| 2018/0123031 A1 | 5/2018 | Adelmann et al. | |
| 2018/0358542 A1 | 12/2018 | Mihajlovic et al. | |
| 2019/0165255 A1 | 5/2019 | Zhu | |
| 2021/0066348 A1 | 3/2021 | Prasad et al. | |
| 2021/0074727 A1 | 3/2021 | Prasad et al. | |
| 2021/0104662 A1* | 4/2021 | Ota | H10B 61/22 |
| 2021/0159392 A1 | 5/2021 | Prasad et al. | |
| 2021/0210676 A1 | 7/2021 | Prasad | |
| 2021/0210677 A1 | 7/2021 | Prasad | |
| 2021/0225421 A1 | 7/2021 | Mihajlovic et al. | |
| 2021/0242279 A1 | 8/2021 | Prasad et al. | |
| 2021/0320245 A1 | 10/2021 | Kalitsov et al. | |
| 2021/0408020 A1 | 12/2021 | Makala et al. | |

OTHER PUBLICATIONS

Song, C. et al., "Recent progress in voltage control of magnetism: Materials, mechanisms, and performance," Progress in Materials Science, vol. 87, pp. 33-82, (2017); https://doi.org/10.1016/j.pmatsci.2017.02.002.

Wang, X. et al., "E-field Control of the RKKY Interaction in FeCoB/Ru/FeCoB/PMN-PT (011) Multiferroic Heterostructures," *Advanced Materials*, vol. 30, pp. 1-8, (2018); 1803612pp. doi:10.1002/adma.201803612.

Wei, G. et al., "Phase-transition-induced large magnetic anisotropy change in VO2/(Co/Pt)2 heterostructure," Appl. Phys. Lett., vol. 114, p. 012407-1 to 012407-5, (2019); https://do:.org/10.1063/16058761.

Yang, Q. et al., "Ionic liquid gating control of RKKY interaction in FeCoB/Ru/FeCoB and (Pt/Co)2/Ru/(Co/Pt)2 multilayers," *Nature Communications*, vol. 9, No. 991, pp. 1-11,, (2018); doi:10.1038/s41467-018-03356-z.

U.S. Appl. No. 17/656,306, filed Mar. 24, 2022, SanDisk Technologies LLC.

U.S. Appl. No. 17/656,310, filed Mar. 24, 2022, SanDisk Technologies LLC.

USPTO Office Communication, Notice of Allowance and Fee(s) Due for U.S. Appl. No. 17/656,306, dated Dec. 8, 2023, 10 pages.

USPTO Office Communication, Non-Final Office Action for U.S. Appl. No. 17/656,310, mailed on Feb. 28, 2024, 14 pages.

* cited by examiner

MAGNETORESISTIVE MEMORY DEVICE AND METHOD OF OPERATING SAME USING PHASE CONTROLLED MAGNETIC ANISOTROPY

RELATED APPLICATIONS

This application is a continuation-in-part (CIP) application of U.S. application Ser. No. 17/656,310 filed on Mar. 24, 2022, the entire contents of which are incorporated herein by reference.

FIELD

The present disclosure relates generally to the field of magnetic memory devices and specifically to magnetoresistive memory devices and methods of operating the same using magnetic anisotropy modulation employing phase transition.

BACKGROUND

Spin-transfer torque (STT) refers to an effect in which the orientation of a magnetic layer in a magnetic junction structure or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic junction structure or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic junction structure between different magnetization states of the free layer can be employed to store data within the magnetoresistive random access memory (MRAM) cell depending on whether the magnetization of the free layer is parallel or antiparallel to the magnetization of the polarizer layer, also known as a reference layer.

SUMMARY

According to an aspect of the present disclosure, a memory device comprising a magnetoresistive memory cell is provided, which comprises: a first terminal electrode; a second terminal electrode; and a magnetoresistive layer stack located between the first terminal electrode and the second terminal electrode and comprising, from one side to another, a reference layer, a dielectric tunnel barrier layer, a free layer, and a material layer having two different states of lattice deformation which have different average in-plane lattice constants and which are configured to apply different in-plane stress.

According to another aspect of the present disclosure, a method of operating the magnetoresistive memory cell of the present disclosure is provided, which comprises inducing an insulator-to-conductor phase transition in the MIT material by applying a programming voltage pulse between the first terminal electrode and the second terminal electrode.

According to an aspect of the present disclosure, a memory device includes at least one three-terminal magnetoresistive memory cell which comprises a first terminal electrode, a second terminal electrode, a middle electrode located between the first terminal electrode and the second terminal electrode, a magnetoresistive layer stack comprising a reference layer, a free layer and a nonmagnetic spacer layer located between the reference layer and the free layer, wherein the magnetoresistive layer stack is located between the first terminal electrode and the middle electrode, and a ferroelectric material layer located between the middle electrode and the second terminal electrode.

According to another aspect of the present disclosure, a memory device includes at least one magnetoresistive memory cell which comprise a first terminal electrode, a second terminal electrode, a magnetoresistive layer stack comprising a reference layer, a free layer and a dielectric tunnel barrier layer located between the reference layer and the free layer, wherein the magnetoresistive layer stack is located between the first terminal electrode and the second terminal electrode, a perpendicular magnetic anisotropy (PMA) layer having a higher PMA than a PMA of the free layer, wherein the PMA layer is located between the second terminal electrode and the magnetoresistive layer stack, a nonmagnetic electrically conductive layer located between the PMA layer and the free layer, and a ferroelectric material layer located between the PMA layer and the second terminal electrode.

BRIEF DESCRIPTION OF THE DRAWINGS

FIG. 6A shows data from a strain-buffered sample with 3 nm Ta inserted between $VO_2$ and perpendicular magnetic anisotropy (PMA) layers. FIG. 6B shows data from a sample with the PMA layers deposited on the $VO_2$ layer.

DETAILED DESCRIPTION

Figure 1:
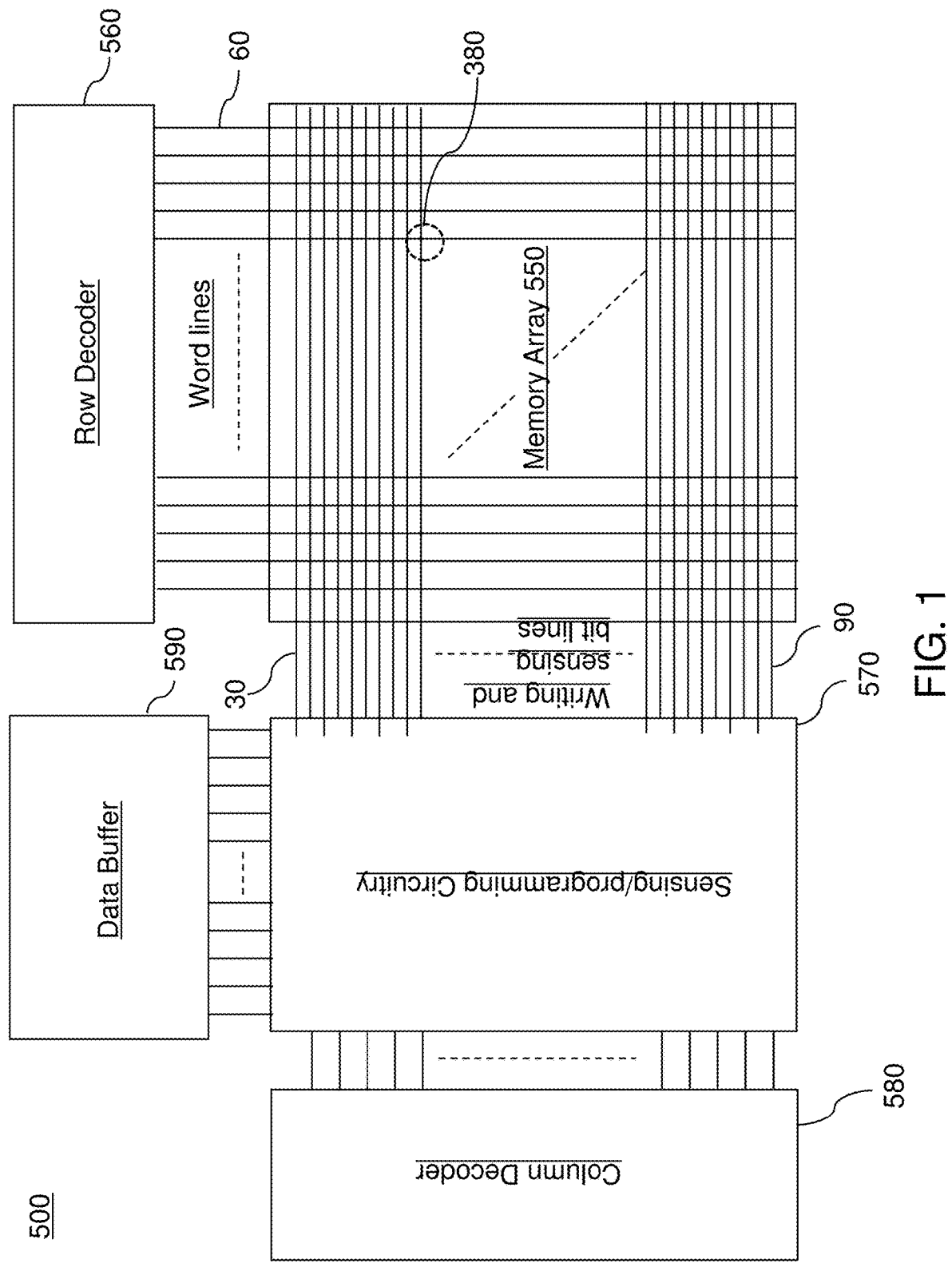
FIG. 1 is a schematic diagram of an exemplary circuit including an array of three-terminal magnetoresistive memory cells according to an embodiment of the present disclosure.

As discussed above, the embodiments of the present disclosure are directed to STT magnetoresistive memory devices and methods of operating the same using magnetic anisotropy modulation employing a phase transition (e.g., phase controlled magnetic anisotropy ("PCMA"), the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1, a schematic diagram is shown for an exemplary circuit including an array of three-terminal memory cells 380 according to the first and second embodiments of the present disclosure. The exemplary circuit may comprise a random access memory (RAM) device 500 including the memory cells 380 in an array configuration. As used herein, a "random access memory" (RAM) refers to a memory device containing memory cells that allow random access, e.g., access to any selected memory cell upon a command for reading the contents of the selected memory cell. According to an aspect of the present disclosure, the memory cells 380 comprise three-terminal magnetoresistive memory cells.

The RAM device 500 includes a memory array region 550 including word lines 60, sensing bit lines 30, and programming (i.e., writing) bit lines 90. In one embodiment, a first terminal electrode of each memory cell 380 can be electrically connected to one of the sensing bit lines 30, and a second terminal electrode of each memory cell 380 can be electrically connected to one of the programming (i.e., writing) bit lines 90. Alternatively, a first terminal electrode of each memory cell 380 can be electrically connected to one of the programming bit lines 90, and a second terminal electrode of each memory cell 380 can be electrically connected to one of the sensing bit lines 30. A third electrode, which is also referred to as a middle electrode, of each memory cell 380 may be connected to one of the word lines 60. In one embodiment, the sensing bit lines may be referred to as first electrically conductive lines 30 and the programming bit lines may be referred to as second electrically conductive lines 90. The word lines may be referred to as third electrically conductive lines 60. While the exemplary circuit illustrates an exemplary configuration for routing the programming bit lines, the sensing lines, and the word lines, various other types of routing of electrically conductive lines may also be employed provided that each memory cell 380 is accessed by a respective set of three different independently-controlled electrically conductive lines. Furthermore, the terms "bit line" and "word line" are arbitrary names that are assigned to various conductive lines for clarity, but should not be considered limiting.

In an illustrative example, the RAM device 500 may also contain a row decoder 560 connected to the word lines 60, a sense amplifier circuitry connected to the sensing bit lines 30, and a programming circuitry connected to the programming bit lines 90. In some embodiments, the sense amplifier circuitry and the programming circuitry are collectively referred to as a sensing/programming circuitry 570. A column decoder 580 and a data buffer 590 can be connected to the sensing/programming circuitry 570. A row decoder 560 can be connected to the word lines 60. Multiple instances of the memory cells 380 are provided in an array configuration that forms the RAM device 500. It should be noted that the location and interconnection of elements are schematic and the elements may be arranged in a different configuration. Further, a memory cell 380 may be manufactured as a discrete device, i.e., a single isolated device.

Each memory cell 380 includes a magnetic junction structure having at least two different resistive states depending on the alignment of magnetizations of different magnetic material layers. The magnetic junction structure within each memory cell 380 is provided between a first terminal electrode and a second terminal electrode. In one embodiment, the magnetic junction structure within each memory cell 380 can be provided between the first terminal electrode and a middle electrode.

Figure 2:
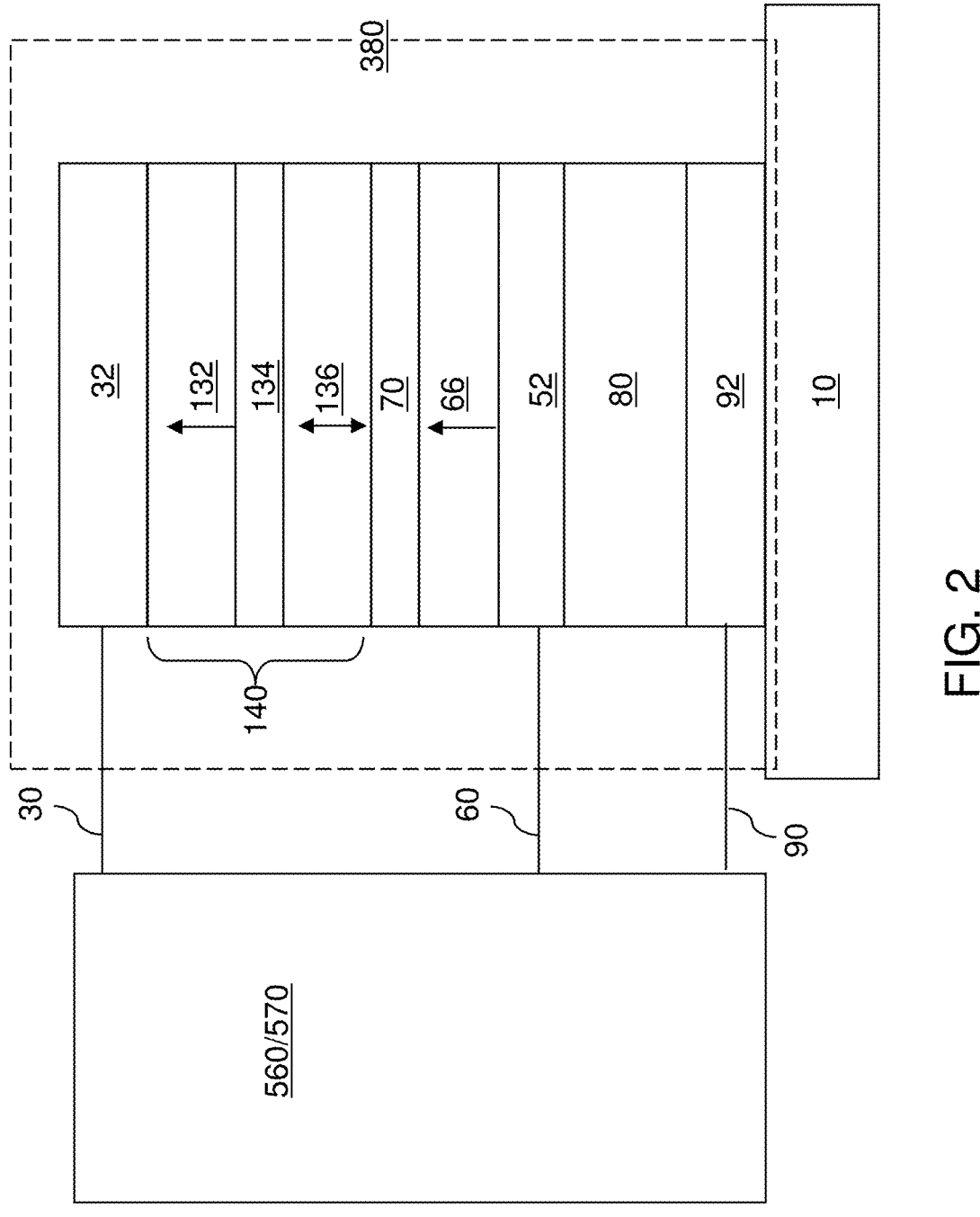
FIG. 2 illustrates a first exemplary magnetoresistive memory device according to a first embodiment of the present disclosure.

Referring to FIG. 2, a first exemplary magnetoresistive memory device according to a first embodiment of the present disclosure is illustrated, which comprises a memory cell 380 that is a three-terminal magnetoresistive memory cell and a portion of a sensing/programming circuitry configured to program the three-terminal magnetoresistive memory cell. The three-terminal magnetoresistive memory cell of FIG. 2 may comprise one memory cell 380 within the MRAM device 500 illustrated in FIG. 1, and the portion of the sensing/programming circuitry illustrated in FIG. 2 may be a portion of the peripheral (i.e., driver) circuitry illustrated in FIG. 1.

Figure 3:
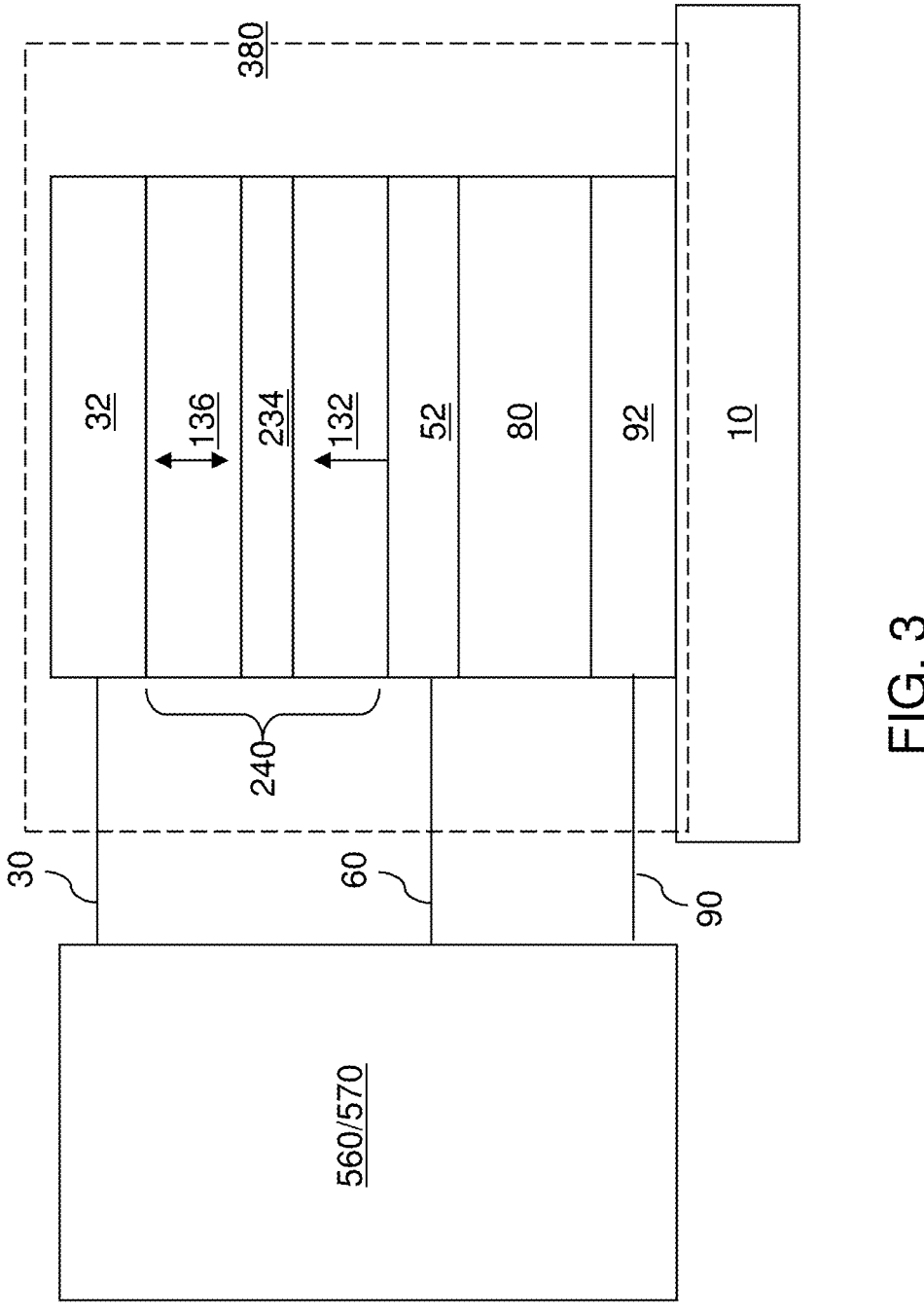
FIG. 3 illustrates a second exemplary magnetoresistive memory device according to a second embodiment of the present disclosure.

According to the first embodiment of the present disclosure, the three-terminal magnetoresistive memory cell illustrated in FIG. 2 may comprise, from one side to another in a sequential order, a first terminal electrode 32, a magnetic junction structure, such as a magnetic tunnel junction (MTJ) 140 (or a giant magnetoresistance (GMR) junction structure 240 illustrated in FIG. 3), a nonmagnetic electrically conductive layer 70, a perpendicular magnetic anisotropy (PMA) layer 66, a middle electrode 52, a ferroelectric material layer 80, and a second terminal electrode 92.

Generally, the three-terminal magnetoresistive memory cell can be formed over a substrate 10 by depositing and patterning various material layers for forming each component of the three-terminal magnetoresistive memory cell.

For example, the substrate 10 may comprise a semiconductor substrate (e.g., silicon wafer) on which various semiconductor devices (such as field effect transistors) are formed, and dielectric material layers embedding metal interconnect structures that are electrically connected to the semiconductor devices. Alternatively, the substrate 10 may comprise an insulating (e.g., glass or ceramic) substrate or a conductive (e.g., metal) substrate. The second electrically conductive line 90 and the second terminal electrode 92 can be formed over the substrate 10. The second terminal electrode 92 may comprise a portion of the second electrically conductive line 90 or it may comprise a separate conductive layer which is electrically connected to the second electrically conductive line 90. The ferroelectric material layer 80 can be deposited over the second terminal electrode 92. A conductive material, such as a metal or metal alloy, may be deposited to form the third electrically conductive line 60 and the middle electrode 52. The third terminal electrode 92 may comprise a portion of the third electrically conductive line 60 or it may comprise a separate conductive layer which is electrically connected to the third electrically conductive line 60. A stack of material layers can be deposited and patterned to form a stack of the PMA layer 66, the nonmagnetic electrically conductive layer 70, and the magnetic junction structure (such as the magnetic tunnel junction 140 or the GMR junction). The first electrically conductive line 30 and the first terminal electrode 32 can be formed over the magnetic junction structure. The second terminal electrode 32 may comprise a portion of the first electrically conductive line 30 or it may comprise a separate conductive layer which is electrically connected to the first electrically conductive line 30. The above layers may be patterned into any desired shape, such as a pillar structure shown in FIG. 2 using one or more patterning (e.g., ion milling or etching) steps. Insulating layer or layers may be formed around the pillar structure and between the various electrically conductive lines.

Alternatively, the order of formation for the combination of the first terminal electrode 32, the magnetic tunnel junction 140, the nonmagnetic electrically conductive layer 70, the PMA layer 66, the middle electrode 52, the ferroelectric material layer 80, and the second terminal electrode 92 may be reversed. Generally, the magnetic junction structure includes a stack of a reference layer 132, a nonmagnetic spacer layer, and a free layer 136. In case the magnetic junction structure includes a magnetic tunnel junction 140 of the first embodiment, then the magnetic tunnel junction 140 can include a layer stack of a reference layer 132, a dielectric tunnel barrier layer 134, and a free layer 136. In case the magnetic junction structure includes the GMR junction structure 240 of the second embodiment, then the dielectric tunnel barrier layer 134 is replaced with a nonmagnetic electrically conductive (e.g., metal or metal alloy) spacer layer 234, as shown in FIG. 3.

Each of the first electrically conductive line 30, the first terminal electrode 32, the second terminal electrode 92, and the second electrically conductive line 90 can include a nonmagnetic electrically conductive material such as W, Al, Cu, Ru, Mo, TiN, TaN, WN, MoN, etc.

The ferroelectric material layer 80 includes a ferroelectric material, which may be a single crystalline ferroelectric material or a polycrystalline ferroelectric material. The crystallographic orientation of the single crystalline ferroelectric material can be selected such that a change in the electrical polarization in the ferroelectric material layer 80 induces a change in an average in-plane strain of the ferroelectric material layer 80. The average in-plane strain refers to the average of the in-plane strain in the ferroelectric material layer 80. An in-plane strain refers to the component of the strain that is measured along a horizontal plane that is perpendicular to a top surface of the ferroelectric material layer 80.

Alternatively, the ferroelectric material layer 80 comprises a polycrystalline ferroelectric material. The distribution of the crystallographic orientations within the grains of the polycrystalline ferroelectric material of the ferroelectric material layer 80 can be such that the ferroelectric material layer 80 can be programmed into two ferroelectric states having a net "upward" ferroelectric polarization or a net "downward" ferroelectric polarization. In one embodiment, the two ferroelectric states of the ferroelectric material layer 80 induce different average in-plane strains in the ferroelectric material layer 80.

In one embodiment, the ferroelectric material layer 80 can include a transition metal oxide material. In one embodiment, the transition metal oxide material comprises a hafnium oxide based material, which comprises doped or undoped hafnium oxide. In an illustrative example, the ferroelectric material layer 80 may include single crystalline hafnium oxide doped with zirconium (also referred to as hafnium-zirconium oxide), silicon, strontium, aluminum, yttrium, germanium and/or gadolinium.

In another embodiment, the transition metal oxide material comprises a perovskite material, such as barium titanate (BaTiO$_3$: BT), europium barium titanate, lead scandium tantalate (such as Pb(Sc$_x$Ta$_{1-x}$)O$_3$), lead titanate (such as PbTiO$_3$; PT), lead zirconate titanate (such as Pb (Zr,Ti)O$_3$; PZT), lithium niobate (such as LiNbO$_3$; LN), (LaAlO$_3$)), potassium niobate (such as KNbO$_3$), sodium bismuth titanate (such as Na$_{0.5}$Bi$_{0.5}$TiO$_3$), lithium tantalate (such as LiTaO$_3$ (LT)), lead lanthanum titanate (such as (Pb,La)TiO$_3$ (PLT)), lead lanthanum zirconate titanate (such as (Pb,La) (Zr,Ti)O$_3$ (PLZT)), strontium titanate (SrTiO$_3$) or strontium ruthenate (SrRuO$_3$).

In one embodiment, the ferroelectric material layer 80 may comprise a multiferroic material. As used herein, a "multiferroic" material refers to a material that exhibits at least two of a ferromagnetic-type order (such as ferromagnetism, antiferromagnetism, or ferrimagnetism), ferroelectricity, and ferroelasticity. As used herein, a "magnetoelectric multiferroic" refers to a material that exhibits a ferromagnetic-type order and ferroelectricity. A change in total magnetization is coupled to a change in total electric polarization in a magnetoelectric multiferroic, and thus, a magnetic transition can be coupled to a change in the ferroelectric polarization and vice versa. In one embodiment, the ferroelectric material layer 80 comprises, and/or consists essentially of, a polycrystalline multiferroic material. The relative orientation between non-zero ferroelectric polarization non-zero magnetization of the magnetoelectric multiferroic material within each grain of the ferroelectric material layer 80 can be invariant upon reversal of a direction of the non-zero ferroelectric polarization of the grain. In an illustrative example, the relative orientation between the ferroelectric polarization of a crystalline grain of BiFeO$_3$ and the magnetization of BiFeO$_3$ of the crystalline grain of BiFeO$_3$ can be invariant upon reversal of a direction of the non-zero ferroelectric polarization of BiFeO$_3$, Generally, the ferroelectric material layer 80 may comprise any polycrystalline multiferroic material or a single crystalline multiferroic material that can generate a non-zero net magnetization along an axial direction either as deposited, or upon application of an initializing magnetic field or an initializing electrical field. In an illustrative example, the ferroelectric material layer 80 may comprise a material selected from $BiFeO_3$, $h\text{-}YMnO_3$, $BaNiF_4$, $PbVO_3$, $BiMnO_3$, $LuFe_2O_4$, $HoMn_2O_5$, $h\text{-}HoMnO_3$, $h\text{-}ScMnO_3$, $h\text{-}ErMnO_3$, $h\text{-}TmMnO_3$, $h\text{-}YbMnO_3$, $h\text{-}LuMnO_3$, $K_2SeO_4$, $Cs_2CdI_4$, $TbMnO_3$, $Ni_3V_2O_8$, $MnWO_4$, CuO, $ZnCr_2Se_4$, $LiCu_2O_2$, and $Ni_3B_7O_{13}I$. The ferroelectric material layer 80 may be deposited by a suitable deposition method such as physical vapor deposition.

The thickness of the ferroelectric material layer 80 may be in a range from 2 nm to 100 nm, such as from 5 nm to 30 nm, for example about 10 nm, although lesser and greater thicknesses may also be employed. A thermal anneal can be performed to improve crystallinity of the material of the ferroelectric material layer 80 and to enhance ferroelectric properties (such as magnitude of electrical polarization) of the ferroelectric material of the ferroelectric material layer 80. In an illustrative example, the ferroelectric material layer 80 may be a doped (e.g., Zr, Si or Al doped) hafnium oxide based ferroelectric layer having the ferroelectric non-centrosymmetric orthorhombic phase after the anneal.

In one embodiment, the ferroelectric material layer 80 comprises, and/or consists essentially of, a transition metal oxide material that is selected from a hafnium oxide based material or a perovskite material. In one embodiment, the ferroelectric material layer 80 is single crystalline or polycrystalline with a predominant crystallographic orientation that is aligned along the vertical direction.

In one embodiment, the ferroelectric material layer 80 has two stable ferroelectric states having two different states of lattice deformation and two different ferroelectric polarization directions. In one embodiment, the two different states of lattice deformation have different average in-plane lattice constants within a horizontal plane. The two different states of lattice deformation apply different in-plane stress (i.e., stress along horizontal direction) to the PMA layer 66 that is subsequently formed on the ferroelectric material layer 80.

The middle electrode 52 includes a thin nonmagnetic metal or metal alloy layer that is thin enough to transmit the strain in the ferroelectric material layer 80 to an overlying material layer, such as the PMA layer 66. In one embodiment, the middle electrode 52 comprises at least one nonmagnetic electrically conductive material such as W, Al Cu, Ru, Mo, Ti, Ta, TiN, TaN, WN, MoN, and/or a stack or an alloy thereof. The thickness of the middle electrode 52 may be in a range from 0.6 nm to 10 nm, such as from 1 nm to 3 nm, although lesser and greater thicknesses may also be employed.

The PMA layer 66 comprises a ferromagnetic material having relatively high perpendicular magnetic anisotropy. The easy axis of magnetization of the PMA layer 66 is parallel to the vertical direction either by pointing upward toward the MTJ 140 or by pointing downward toward the middle electrode 52. In one embodiment, the ferromagnetic material of the PMA layer 66 can include, and/or can consist essentially of a metal or metal alloy which has a higher PMA than that of the free layer 136. For example, the PMA layer 66 may comprise an iron-platinum or an iron-palladium alloy ferromagnetic layer. The thickness of the PMA layer 66 can be in a range from 1 nm to 10 nm, such as from 2 nm to 8 nm, although lesser and greater thicknesses may also be employed.

According to an aspect of the present disclosure, the PMA layer 66 is a strain-modulated ferromagnetic layer having different magnetic interlayer exchange coupling (IEC) magnitude with the free layer 136 depending on the in-plane stress applied by the ferroelectric material layer 80 through the middle electrode 52 to the PMA layer 66. Some ferromagnetic materials have strain-dependent magnetic anisotropy, and the direction of minimum energy of the magnetization of such ferromagnetic materials can switch from one direction to another direction (which may be an opposite direction) depending on the strain applied to the ferroelectric materials. Examples of strain-induced magnetic anisotropy changes are described in Wang et al., E-field Control of the RKKY interaction in FeCoB/Ru/FeCoB/PMN-PT(011) Multiferroic Heterostructures, Advanced Materials, Volume 30, Issue 39 (2018) 1803612, and in Song et al., Recent Progress in voltage control of magnetism: Materials, mechanisms, and performance, Progress in Materials Science, Volume 87, June 2017, Pages 33-82, the entirety of which are incorporated herein by reference.

The nonmagnetic electrically conductive layer 70 is a nonmagnetic spacer layer that includes a metallic material (e.g., metal or metal alloy) that includes a medium for a Ruderman-Kittel-Kasuya-Yosida (RKKY) interaction, which is a long range magnetic exchange coupling mediated by d-shell electron spins or f-shell electron spins of the nonmagnetic elemental metal within the nonmagnetic electrically conductive layer 70. Generally, the nonmagnetic electrically conductive layer 70 may include any nonmagnetic elemental metal that can function as the medium for the RKKY interaction between the PMA layer 66 and the free layer 136. For example, the nonmagnetic electrically conductive layer 70 may include Al, Ti, V, Cr, Mn, Cu, Zn, Zr, Nb, Mo, Ru, Rh, Pd, Ag, Hf, Ta, W, Os, Jr, Pt, Au, etc. For example, the nonmagnetic electrically conductive layer 70 may comprise an Al, Ta or Jr spacer layer.

According to an aspect of the present disclosure, the thickness of the nonmagnetic electrically conductive layer 70 is selected such that the sign of the RKKY exchange coupling between the PMA layer 66 and the free layer 136 changes depending on the ferroelectric state of the ferroelectric material layer 80, which causes the magnetization direction of the free layer 136 to change. In an illustrative example, the thickness of the nonmagnetic electrically conductive layer 70 may be in a range from 0.6 nm to 5 nm, such as from 1.2 nm to 3 nm, although lesser and greater thicknesses may also be employed.

The free layer 136 includes a ferromagnetic material such as CoFeB, CoFe or a combination thereof. If a CoFeB alloy is included in the free layer 136, then the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). The thickness of the free layer 136 can be in a range from 0.5 nm to 2 nm, although lesser and greater thicknesses can also be employed.

The nonmagnetic spacer layer may be a dielectric tunnel barrier layer 134 for forming a magnetic tunnel junction, or may be a metallic spacer layer for forming a giant magnetoresistive structure. For example, the dielectric tunnel barrier layer 134 may comprise, and/or may consist essentially of magnesium oxide. In one embodiment, the dielectric tunnel barrier layer 134 has a thickness in a range from 0.5 nm to 1.5 nm, such as from 0.8 nm to 1 nm.

The reference layer 132 can include a CoFe layer, a CoFeB layer or a combination thereof. The thickness of the reference layer 133 can be in a range from 1 nm to 5 nm, although lesser and greater thicknesses can also be employed. The reference layer 132 has a fixed magnetization that does not change during operation of the memory cell 380. The direction of the fixed magnetization direction of the reference layer 132 is herein referred to as a fixed reference magnetization direction, which may be an upward vertical direction or a downward vertical direction. The magnetization direction of the reference layer 132 may be fixed by a hard magnetic layer or a synthetic antiferromagnetic (SAF) structure (not shown) located above the reference layer 132.

The magnetization direction of the free layer 136 can change during operation of the memory cell 380. The magnetization direction of the free layer 136 is herein referred to as a free magnetization direction.

The magnetization of the PMA layer 66 remains fixed during operation of the memory cell 380. The magnetization direction of the PMA layer 66 is herein referred to as a PMA magnetization direction, which may be parallel or antiparallel to the direction of the magnetization of the reference layer 32. The exchange coupling between the magnetization of the free layer 136 and the magnetization of the PMA layer 66 is mediated by an RKKY interaction, and as such, the sign of the exchange coupling may be positive or negative. As discussed above, the sign of the interlayer exchange coupling reverses (i.e., changes) depending on the change in strain of the PMA layer 66. The strain of the PMA layer 66 is changed by the change of the ferroelectric polarization direction of the ferroelectric material layer 80. The ferroelectric polarization direction of the ferroelectric material layer 80 is changed by applying a voltage or current between the second terminal electrode (i.e., the programming electrode) 92 and the middle electrode 52. Thus, the energetically favorable direction for the magnetization of the free layer 136 changes with a small change in the strain of the PMA layer 66, which can be induced by the ferroelectric transition in the ferroelectric material layer 80.

According to an aspect of the present disclosure, the exchange coupling between the free layer 136 and the PMA layer 66 can be positive or negative depending on the relative alignment (i.e., parallel alignment or antiparallel alignment) and depending on the strain applied by the ferroelectric material layer 80 to the strain-modulated ferromagnetic PMA layer 66. Specifically, the sign of the interlayer exchange coupling between the free layer 136 and the PMA layer 66 may be negative for one of the parallel or antiparallel alignment of the magnetizations of the free layer 136 and the PMA layer 66 when the ferroelectric material layer 80 is in a first ferroelectric state, and may be positive for the other of the parallel or antiparallel alignment when the ferroelectric material layer 80 is in a second ferroelectric state. The two different ferroelectric states may have opposite ferroelectric polarization directions.

Generally, the sign of the interlayer exchange coupling between the free layer 136 and the PMA layer 66 changes when the ferroelectric state of the ferroelectric material layer 80 changes between the first ferroelectric state that applies a first in-plane average stress to the PMA layer 66, and the second ferroelectric state that applies a second in-plane average stress to the PMA layer 66. A change in the sign of the interlayer exchange coupling between the free layer 136 and the magnetization of the PMA layer 66 causes flipping of the magnetization direction of the free layer 136 between a parallel alignment and an antiparallel alignment with the constant magnetization direction of the PMA layer 66.

In the first exemplary memory cell 380, the magnetic tunnel junction 140 can be configured such that the free layer 136 is spaced from the PMA layer 66 by the nonmagnetic electrically conductive layer 70, which is different from a nonmetallic spacer layer (such as the dielectric tunnel barrier layer 134) that is provided between the reference layer 132 and the free layer 136. The ferroelectric material layer 80 may be located directly on a first surface of the middle electrode 52, and the PMA layer 66 may be located directly on a second surface of the middle electrode 52. The free layer 136 has a free magnetization having two stable magnetization directions. The sign of magnetic interlayer exchange coupling between the PMA layer 66 and the free layer 136 is different for the two stable ferroelectric states of the ferroelectric material layer 80.

Generally, a strain-modulated ferromagnetic PMA layer 66 may be located directly on a second surface of the middle electrode 52. A magnetoresistive layer stack comprising the reference layer 132, the nonmagnetic spacer layer, and the free layer 136 can be disposed between the first terminal electrode 32 and the middle electrode 52. In the first embodiment, the nonmagnetic spacer layer may comprise the dielectric tunnel barrier layer 134. In this case, the magnetoresistive layer stack comprises a magnetic tunnel junction providing a tunneling magnetoresistance (TMR) effect. In the second embodiment described below with respect to FIG. 3, the nonmagnetic spacer layer may be nonmagnetic electrically conductive spacer layer (i.e., a second nonmagnetic electrically conductive layer) 234. In this case, the magnetoresistive layer stack comprises a giant magnetoresistive stack providing the giant magnetoresistance (GMR) effect.

Generally, a programming circuit can be provided, which can be electrically connected to the middle electrode 52 and the second terminal electrode 92. The programming circuit can be configured to apply two types of programming voltage pulses between the middle electrode 52 and the second terminal electrode 92 (e.g., between the programming bit line 90 and the word line 60). In one embodiment, the two types of programming voltage pulses may have two different polarities (i.e., a positive polarity for one type of programming pulse and a negative polarity for another type of programming pulse), and may have magnitudes that induce a ferroelectric transition of the ferroelectric material layer 80 between two ferroelectric states. For example, the magnitude of each pulse may be in a range from 0.5 V to 5 V, such as from 1 V to 4 V.

A sensing circuit can be provided, which can be electrically connected to the first terminal electrode 32 and the middle electrode 52, and can be configured to apply a sensing voltage pulse across the first terminal electrode 32 and the middle electrode 52. The sensing circuit can be configured to measure tunneling magnetoresistance (TMR) of the magnetoresistive layer stack 140 by applying a sensing (i.e., read) voltage between the first terminal electrode 32 and the middle electrode 52 (e.g., between the sensing bit line 30 and the word line 60), and measuring the TMR (e.g., measuring the tunneling current and determining the TMR) through the MTJ 140. The sensing voltage magnitude should be sufficiently small to avoid changing the magnetization direction of the free layer 136.

Referring to FIG. 3, a second exemplary magnetoresistive memory device according to a second embodiment of the present disclosure is illustrated, which can be derived from the first exemplary magnetoresistive memory device illustrated in FIG. 3 by omitting the nonmagnetic electrically conductive layer 70 and the PMA layer 66, and by employing the giant magnetoresistance (GMR) junction structure 240 as a magnetic junction structure. In this case, the GMR junction structure 240 includes a reference layer 132, a nonmagnetic spacer layer that is a nonmagnetic electrically conductive layer (e.g., a nonmagnetic metal spacer layer) 234, and a free layer 136. The material composition and the thickness range of each element of the second exemplary magnetoresistive memory device that has a counterpart with a same reference numeral in the first exemplary magnetoresistive memory device can be the same as in the first exemplary magnetoresistive memory device.

In the second exemplary magnetoresistive memory device, the reference layer 132 may be located over or directly on the second surface of the middle electrode 52. The free layer 136 may be more distal from the middle electrode 52 than the reference layer 132 is from the middle electrode 52, and is spaced from the reference layer 132 by the nonmagnetic electrically conductive layer 234. According to an aspect of the present disclosure, the nonmagnetic electrically conductive layer 234 provides the interlayer exchange coupling between the free layer 136 and the reference layer 132. Therefore, the PMA layer 66 is not required in the second embodiment to provide an interlayer exchange coupling to the free layer 136 which causes the magnetization direction of the free layer 136 to switch when the sign of the interlayer exchange coupling changes.

Specifically, the nonmagnetic electrically conductive layer 234 is a nonmagnetic spacer layer that includes a metallic material that includes a medium for a Ruderman-Kittel-Kasuya-Yosida (RKKY) interaction. Generally, the nonmagnetic electrically conductive layer 234 may include any nonmagnetic elemental metal that can function as the medium for the RKKY interaction between the reference layer 132 and the free layer 136. For example, the nonmagnetic electrically conductive layer 234 may include Al, Ti, V, Cr, Mn, Cu, Zn, Zr, Nb, Mo, Ru, Rh, Pd, Ag, Cd, La, Ce, Pr, Pm, Eu, Er, Tm, Yb, Lu, Hf, Ta, W, Re, Os, Jr, Pt, Au, etc. In an illustrative example, the thickness of the nonmagnetic electrically conductive layer 234 may be in a range from 0.6 nm to 5 nm, such as from 1.2 nm to 3 nm, although lesser and greater thicknesses may also be employed.

According to the second embodiment, the sign of the RKKY interlayer exchange coupling between the reference layer 132 and the free layer 136 changes depending on the ferroelectric state of the ferroelectric material layer 80. In the second embodiment, an applied programming (i.e., writing) voltage between the middle electrode 52 and the second terminal electrode 32 changes the ferroelectric polarization direction of the ferroelectric material layer 80. As in the first embodiment, the change in the ferroelectric polarization direction creates strain that propagates though the thin middle electrode 52 and reverses the sign of interlayer exchange coupling between the reference layer 132 and the free layer 136. Reversing the sign of the interlayer exchange coupling changes the magnetization direction of the free layer 136. This changes the resistance state (i.e., the GMR state) of the GMR junction structure 240, which corresponds to programming (i.e., writing) the memory cell 380 of the second embodiment.

To read the memory cell 380, a small sensing (i.e., read) voltage (i.e., smaller magnitude voltage than the programming voltage) is applied between the middle electrode 52 and the first terminal electrode 32. The current measured between these electrodes is then used to determine the GMR state of the GMR junction structure 240 (i.e., the resistance state of the memory cell 380).

Figure 4:
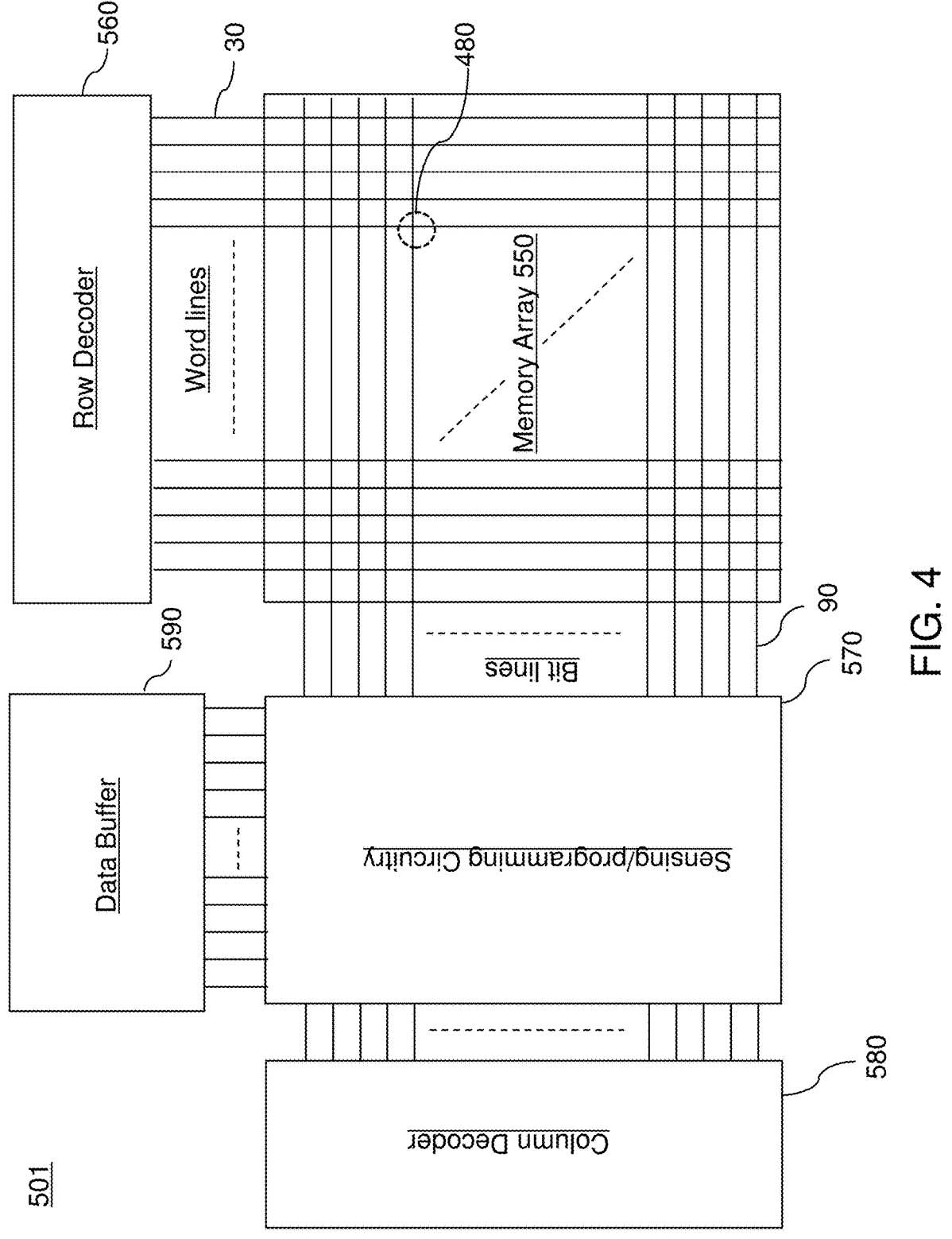
FIG. 4 is a schematic diagram of an exemplary circuit including an array of two-terminal magnetoresistive memory cells according to an embodiment of the present disclosure.

Referring to FIG. 4, a schematic diagram is shown for an exemplary circuit including an array of two terminal memory cells 480 of the third embodiment. The array of memory cells 480 may be configured as a two-dimensional array or as a three-dimensional array including a stack of multiple two-dimensional arrays. In one embodiment, the exemplary circuit may comprise a random access memory (RAM) device 501 including the memory cells 480 in an array configuration. According to an aspect of the present disclosure, the memory cells 480 may comprise two-terminal magnetoresistive memory cells. In this case, the RAM device 501 can be a random access memory device including a two-terminal magnetoresistive memory element within each memory cell 480.

In one embodiment, the RAM device 501 includes a memory array region 550 including word lines and bit lines. In one embodiment, a first terminal electrode of each memory cell 480 can be electrically connected to one of the bit lines, and a second terminal electrode of each memory cell 480 can be electrically connected to one of the word lines. In one embodiment, the bit lines may comprise the first electrically conductive lines 30 and the word lines may comprise the second electrically conductive lines 90. Alternatively, the word lines may comprise the first electrically conductive lines 30 and the bit lines comprise the second electrically conductive lines 90. While the exemplary circuit illustrates an exemplary configuration for routing the bit lines and the word lines, various other types of routing electrically conductive lines may also be employed provided that each memory cell 480 is accessed by a respective set of two different independently-controlled electrically conductive lines. In the third embodiment, each bit line functions as both a sensing and as a programming bit line, depending on the magnitude of the voltage applied to the bit line. Thus, separate sensing bit lines of the first and second embodiment are omitted in the third embodiment.

In an illustrative example, the RAM device 501 may also contain a row decoder 560 connected to the word lines and a sensing/programming circuitry 570 connected to the bit lines. A column decoder 580 and a data buffer 590 can be connected to the sensing/programming circuitry 570. Multiple instances of the memory cells 480 are provided in an array configuration that forms the RAM device 501. It should be noted that the location and interconnection of elements are schematic and the elements may be arranged in a different configuration. Further, a memory cell 480 may be manufactured as a discrete device, i.e., a single isolated device.

Each memory cell 480 includes a magnetic junction structure having at least two different resistive states depending on the alignment of magnetizations of different magnetic material layers. The magnetic junction structure within each memory cell 480 is provided between a first terminal electrode and a second terminal electrode.

Figure 5:
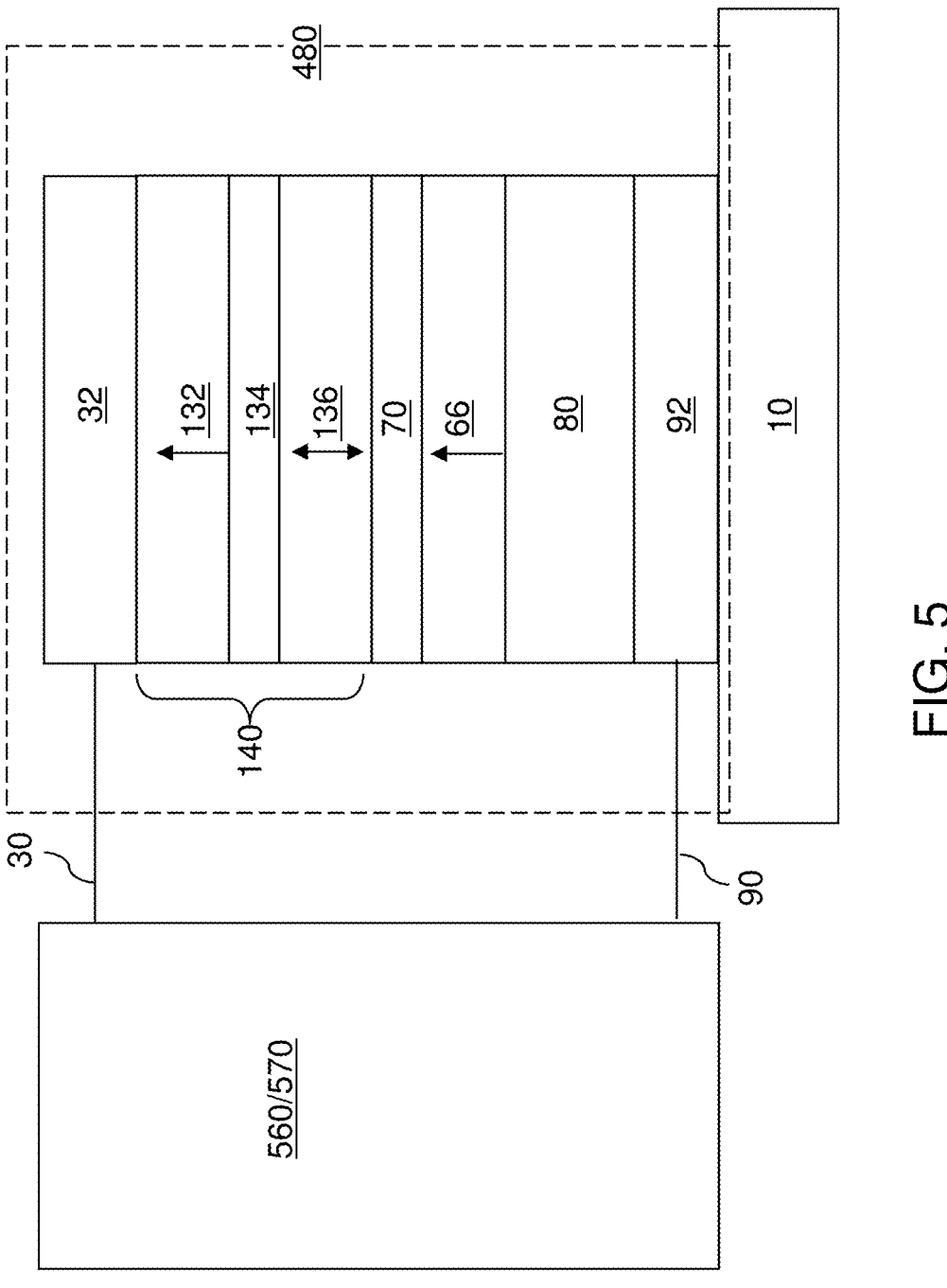
FIG. 5 illustrates a third exemplary magnetoresistive memory device according to a third embodiment of the present disclosure.

Referring to FIG. 5, a third exemplary magnetoresistive memory device according to the third embodiment of the present disclosure is illustrated, which comprises a memory cell 480 that is a two-terminal magnetoresistive memory cell, and a portion of a sensing/programming circuitry configured to program the two-terminal magnetoresistive memory cell. The two-terminal magnetometries memory cell of FIG. 5 may be employed as a memory cell 480 within the MRAM device 501 illustrated in FIG. 4, and the portion of the sensing/programming circuitry illustrated in FIG. 5 may be a portion of the periphery circuitry illustrated in FIG. 5.

According to the embodiment of the present disclosure, the two-terminal magnetoresistive memory cell 480 illustrated in FIG. 5 may be derived from the three-terminal magnetoresistive memory cell 380 illustrated in FIG. 2 by omitting formation of the middle electrode 52. In this case, the two-terminal magnetoresistive memory cell 380 may comprise, from one side to another in a sequential order, a first terminal electrode 32, the magnetic junction structure, such as the magnetic tunnel junction 140, the nonmagnetic electrically conductive layer 70, the PMA layer 66, the ferroelectric material layer 80, and the second terminal electrode 92, as described above with respect to the first embodiment of FIG. 2. Thus, the various components of the two-terminal magnetoresistive memory cell 480 may have the same material composition and the same thickness range as a counterpart in the three-terminal magnetoresistive memory cell 380 having the same reference numeral.

The two-terminal magnetoresistive memory cell 480 of the third embodiment is programmed by applying a programming voltage between the first terminal electrode 32 and the second terminal electrode 92. The programming (i.e., writing) voltage changes the ferroelectric polarization direction of the ferroelectric material layer 80. As in the first embodiment, the change in the ferroelectric polarization direction creates strain in the adjacent PMA layer 66. The stain induced in the PMA layer 66 reverses the sign of interlayer exchange coupling between the PMA layer 66 and the free layer 136. Reversing the sign of the interlayer exchange coupling changes the magnetization direction of the free layer 136. This changes the resistance state (i.e., the TMR state) of the tunnel junction structure 140, which corresponds to programming (i.e., writing) the memory cell 480 of the third embodiment. The third embodiment is advantageous compared to the first embodiment in that the strain is provided directed from the ferroelectric material layer 80 to the adjacent PMA layer 66 without having to be transmitted through the middle electrode 52. Thus, a greater strain induced effect may be provided to the PMA layer 66 to improve the switching of the magnetization direction of the free layer 136.

To read the memory cell 480, a small sensing (i.e., read) voltage (i.e., smaller magnitude voltage than the programming voltage) is applied between the first terminal electrode 32 and the second terminal electrode 92. The read current measured between these electrodes is then used to determine the resistance state (e.g., the TMR state) of the MTJ 140 (i.e., the resistance state of the memory cell 480). The sensing voltage of the third embodiment may be higher than the sensing voltage of the first embodiment because the tunneling current has to tunnel through the insulating ferroelectric material layer 80 in order to be detected.

A memory device 500 of the first and second embodiments of FIGS. 1-3 includes at least one three-terminal magnetoresistive memory cell 380 which comprises a first terminal electrode 32, a second terminal electrode 92, a middle electrode 52 located between the first terminal electrode 32 and the second terminal electrode 92, a magnetoresistive layer stack (140, 240) comprising a reference layer 132, a free layer 136 and a nonmagnetic spacer layer (134, 234) located between the reference layer and the free layer, wherein the magnetoresistive layer stack is located between the first terminal electrode 32 and the middle electrode 52, and a ferroelectric material layer 80 located between the middle electrode 52 and the second terminal electrode 80.

In the first embodiment shown in FIG. 2, a perpendicular magnetic anisotropy (PMA) layer 66 is located between the ferroelectric material layer 80 and the magnetoresistive layer stack 140, and nonmagnetic electrically conductive layer 70 is located between the PMA layer 66 and the free layer 33.

In the first embodiment, the nonmagnetic spacer layer 134 comprises a dielectric tunnel barrier layer, the magnetoresistive layer stack comprises a magnetic tunnel junction 140, the PMA layer 66 has a higher PMA than a PMA of the free layer 136, and the PMA layer 66 and the free layer 136 are magnetically exchange-coupled across the nonmagnetic electrically conductive layer 70. A sign of an interlayer exchange coupling coefficient of the magnetic coupling between the PMA layer 66 and the free layer changes 136 based on a strain applied to the PMA layer 66 by the ferroelectric material layer 80 across the middle electrode 52. The ferroelectric material layer 80 has two stable ferroelectric states having two different states of lattice deformation.

In the first embodiment, a programming circuit (560, 570) is electrically connected to the middle electrode 52 and the second terminal electrode 92 and configured to apply two types of programming voltages between the middle electrode and the second terminal electrode. The two types of programming voltages have two different polarities and have magnitudes that induce a ferroelectric transition of the ferroelectric material layer 80 between the two stable ferroelectric states. The two stable ferroelectric states of the ferroelectric material layer 80 apply different first and second in-plane stresses to the PMA layer 66 across the middle electrode 52, a change between the first and the second in-plane stresses applied to the PMA layer 66 changes the sign of the interlayer coupling coefficient between the PMA layer 66 and the free layer 136, and the change of the sign of the interlayer coupling coefficient changes a magnetization direction of the free layer 136. A sensing circuit 570 is electrically connected to the first terminal electrode 32 and the middle electrode 52 and configured to apply a sensing voltage between the first terminal electrode and the middle electrode to determine a tunneling magnetoresistance across the magnetoresistive layer stack 140.

In the first embodiment, a first (e.g., bottom) surface of the PMA layer 66 directly contacts a first (e.g., top) surface of the middle electrode 52, a surface of the ferroelectric material layer 80 directly contacts a second (e.g., bottom) surface of the middle electrode 52 opposite to the first surface of the middle electrode, a second (e.g., top) surface of the PMA layer 66 directly contacts a first (e.g., bottom) surface of the nonmagnetic electrically conductive layer 70, a first (e.g., bottom) surface of the free layer 136 directly contacts a second (e.g., top) surface of the nonmagnetic electrically conductive layer 70 opposite to the first surface of the nonmagnetic electrically conductive layer, and a second (e.g., top) surface of the free layer directly contacts a surface of the dielectric tunnel barrier layer 134. The free layer 136 may comprise a CoFe or CoFeB ferromagnetic layer, and the PMA layer 66 may comprise a FePt or FePd ferromagnetic layer or a Co/Pt multilayer (i.e., a stack of alternating Co and Pt layers).

A method of operating the three-terminal magnetoresistive memory cell 380 of the first embodiment includes applying a first programming voltage between the second terminal electrode 92 and the middle electrode 52 to change a state of the ferroelectric material layer 80 from a second ferroelectric state to a first ferroelectric state, such that a first in-plane stress is applied to the PMA layer 66 across the middle electrode 52, which changes the sign of the interlayer coupling coefficient between the PMA layer 66 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the middle electrode 52 to change the state of the ferroelectric material layer 80 from the first ferroelectric state to the second ferroelectric state, such that a second in-plane stress is applied to the PMA layer 66 across the middle electrode 52, which changes the sign of the interlayer coupling coefficient between the PMA layer 66 and the free layer 136 and changes the magnetization direction of the free layer 136 to be antiparallel to the magnetization direction of the reference layer 132. The method also includes applying a sensing voltage between the first terminal electrode 32 and the middle electrode 52 to determine a tunneling magnetoresistance across the magnetoresistive layer stack 140.

In the second embodiment shown in FIG. 3, the nonmagnetic spacer layer comprises a nonmagnetic electrically conductive spacer layer 234, the magnetoresistive layer stack 240 comprises a giant magnetoresistance (GMR) junction structure, the reference layer 132 and the free layer 136 are magnetically coupled across the nonmagnetic electrically conductive spacer layer 234, and a sign of an interlayer exchange coupling coefficient of the magnetic coupling between the reference layer 132 and the free layer 135 changes based on a strain applied to the reference layer 132 by the ferroelectric material layer 80 across the middle electrode 52.

In the second embodiment, the programming circuit (560, 570) is electrically connected to the middle electrode 52 and the second terminal electrode 92 and configured to apply two types of programming voltages between the middle electrode and the second terminal electrode, and a sensing circuit 570 is electrically connected to the first terminal electrode 32 and the middle electrode 52 and configured to apply a sensing voltage between the first terminal electrode and the middle electrode to determine a magnetoresistance across the magnetoresistive layer stack 240.

In the second embodiment, the ferroelectric material layer 80 has two stable ferroelectric states having two different states of lattice deformation, the two types of programming voltages have two different polarities and have magnitudes that induce a ferroelectric transition of the ferroelectric material layer 80 between the two stable ferroelectric states, the two stable ferroelectric states of the ferroelectric material layer 80 apply different first and second in-plane stresses to the reference layer 132 across the middle electrode 52, a change between the first and the second in-plane stresses applied to the reference layer 132 changes the sign of the interlayer coupling coefficient between the reference layer 132 and the free layer 136, and the change of the sign of the interlayer coupling coefficient changes a magnetization direction of the free layer 136.

In the second embodiment, a surface of the reference layer 132 directly contacts a first (e.g., top) surface of the middle electrode 52, and a surface of the ferroelectric material layer 80 directly contacts a second (e.g., bottom) surface of the middle electrode opposite 52 to the first surface of the middle electrode.

A method of operating the three-terminal magnetoresistive memory cell 380 of the second embodiment includes applying a first programming voltage between the second terminal electrode 92 and the middle electrode 52 to change a state of the ferroelectric material layer 80 from a second ferroelectric state to a first ferroelectric state, such that a first in-plane stress is applied to the reference layer 132 across the middle electrode 52, which changes the sign of the interlayer coupling coefficient between the reference layer 132 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the middle electrode 52 to change the state of the ferroelectric material layer 80 from the first ferroelectric state to the second ferroelectric state, such that a second in-plane stress is applied to the reference layer 132 across the middle electrode 52, which changes of the sign of the interlayer coupling coefficient between the reference layer 132 and the free layer 136 and changes the magnetization direction of the free layer 136 to be antiparallel to the magnetization direction of the reference layer 132. The method also includes applying a sensing voltage between the first terminal electrode 32 and the middle electrode 52 to determine a magnetoresistance across the magnetoresistive layer stack 240.

In the first and third embodiments shown in FIGS. 1, 2, 4 and 5, a memory device (500, 501) includes at least one magnetoresistive memory cell (380, 480) which comprise a first terminal electrode 32, a second terminal electrode 92, a magnetoresistive layer stack 140 comprising a reference layer 132, a free layer 136 and a dielectric tunnel barrier layer 134 located between the reference layer and the free layer, wherein the magnetoresistive layer stack 140 is located between the first terminal electrode and the second terminal electrode, a perpendicular magnetic anisotropy (PMA) layer 66 having a higher PMA than a PMA of the free layer 136, wherein the PMA layer is located between the second terminal electrode 92 and the magnetoresistive layer stack 140, a nonmagnetic electrically conductive layer 70 located between the PMA layer 66 and the free layer 136, and a ferroelectric material layer 80 located between the PMA layer 66 and the second terminal electrode 92.

In the first embodiment shown in FIG. 2, a middle electrode 52 is located between the ferroelectric material layer 80 and the PMA layer 66, as described above.

In the third embodiment shown in FIG. 5, the PMA layer 66 is in contact with the ferroelectric material layer 80 and the nonmagnetic electrically conductive layer 70. The PMA layer 66 and the free layer 136 are magnetically exchange-coupled across the nonmagnetic electrically conductive layer 70. The magnetic coupling between the PMA layer 66 and the free layer 136 is modulated by strain within the PMA layer 66. A sign of an interlayer exchange coupling coefficient of the magnetic coupling between the PMA layer 66 and the free layer 136 changes based on a strain applied to the PMA layer 66 by the ferroelectric material layer 80.

In the third embodiment, a programming circuit (560, 570) is electrically connected to the first terminal electrode 32 and the second terminal electrode 92 and configured to apply two types of programming voltages between the first terminal electrode and the second terminal electrode. The two types of programming voltages have two different polarities and have magnitudes that induce a ferroelectric transition of the ferroelectric material layer 80 between the two ferroelectric states. A sensing circuit 570 is electrically connected to the first terminal electrode 32 and the second terminal electrode 92 and configured to apply a sensing voltage between the first terminal electrode and the second terminal electrode. The sensing circuit 570 is configured to measure a tunneling magnetoresistance (TMR) of the magnetoresistive layer stack 140.

A method of operating the two terminal magnetoresistive memory cell of 480 of the third embodiment includes applying a first programming voltage between the second terminal electrode 92 and the first terminal electrode 32 to change a state of the ferroelectric material layer 80 from a second ferroelectric state to a first ferroelectric state, such that a first in-plane stress is applied to the PMA layer 66 by the ferroelectric material layer 80, which changes the sign of the interlayer coupling coefficient between the PMA layer 66 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the first terminal electrode 32 to change the state of the ferroelectric material layer 80 from the first ferroelectric state to the second ferroelectric state, such that a second in-plane stress is applied to the PMA layer 66 by the ferroelectric material layer 80, which changes the sign of the interlayer coupling coefficient between the PMA layer 66 and the free layer 136 and changes the magnetization direction of the free layer 136 to be antiparallel to the magnetization direction of the reference layer 132. The method also includes applying a sensing voltage between the first terminal electrode 32 and the second terminal electrode 92 to determine a tunneling magnetoresistance across the magnetoresistive layer stack 140.

Thus, in the embodiments of the present disclosure, the magnetization direction of the free layer may be set using ferroelectric controlled interlayer exchange coupling of the ferromagnetic free layer and another ferromagnetic layer (e.g., the PMA layer or the reference layer). The electric field controlled strain from ferroelectric material layer that reverses the sign of exchange coupling between ferromagnetic layers. Written information can be read through either TMR or GMR effect.

According to a fourth embodiment of the present disclosure, a STT MRAM device includes a phase change material layer other than a ferroelectric material layer which experiences a phase transition and thus impose a strain on the free layer to reduce the PMA of free layer. In one aspect of the fourth embodiment, a phase change material layer which experiences a metal-insulator (e.g., metal to insulator) transition (MIT), such as a metal oxide material layer, is added to the STT MRAM device as a capping layer on the side of the free layer which faces away from the MTJ 140. Such a phase transition may be caused by various mechanisms, such as a change in temperature, an application of current or voltage, etc.

In prior art spin-transfer torque magnetoresistive random access memory (STT-MRAM) devices, continued scalability of the STT-MRAM devices based on interfacial perpendicular magnetic anisotropy needs a significant enhancement to perpendicular magnetic anisotropy (PMA) in order to provide a desired thermal stability for reliable information retention in the STT-MRAM devices. As a result, higher current densities are needed to switch magnetization configuration within the STT-MRAM devices.

Figures 6A, 6B:
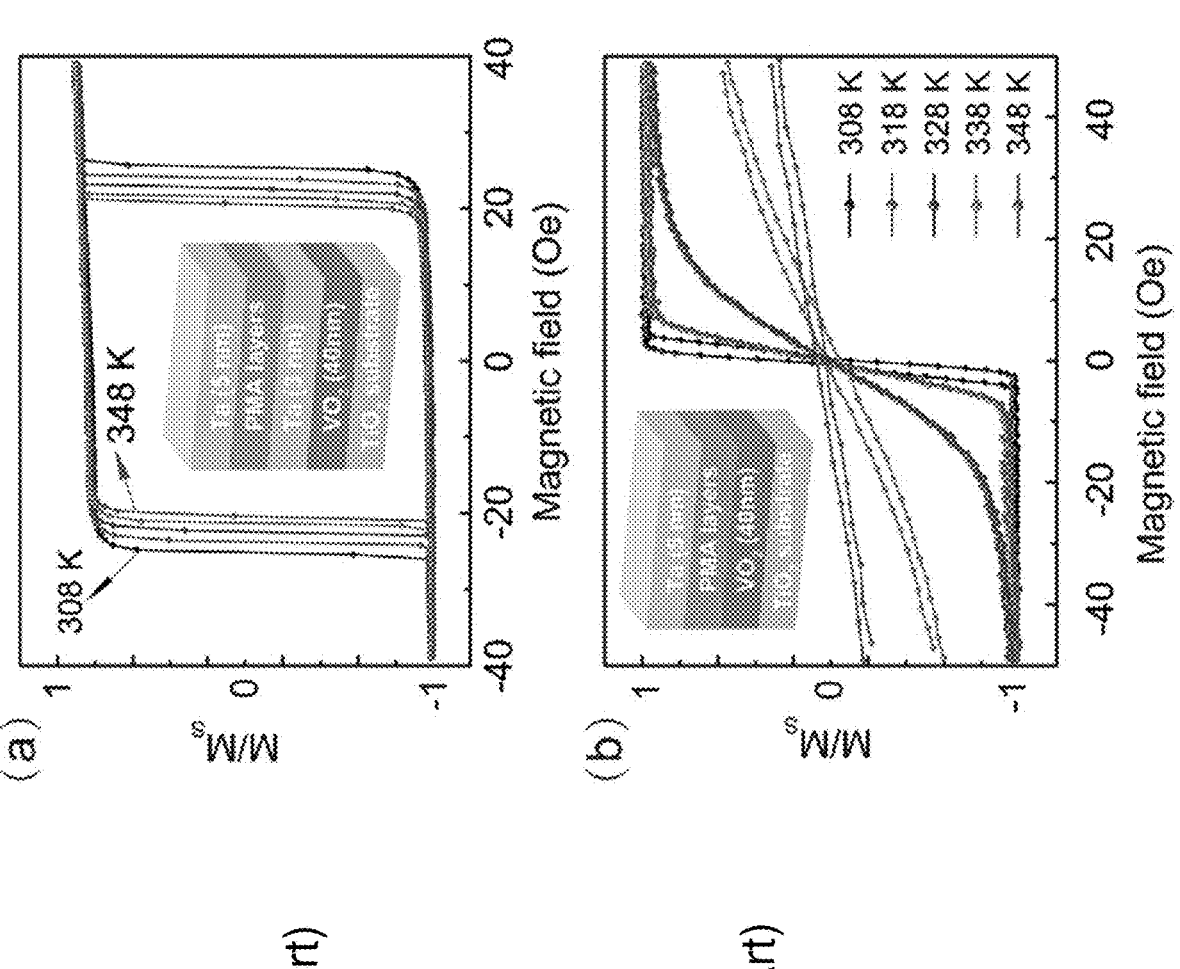
FIGS. 6A and 6B illustrate out-of-plane (OOP) hysteresis loops measured by magneto-optic Kerr effect (MOKE) at different temperatures of prior art devices.

A phase change material layer located adjacent to or in contact with a perpendicular magnetic anisotropy material can alter the magnetic characteristics of the perpendicular magnetic anisotropy material. FIGS. 6A and 6B illustrate modulation of the magnetic characteristics of PMA layers due to an addition of a Mott oxide material, VO₂, into a PMA device. FIGS. 6A and 6B represent experimental data presented in G. Wei et al., *Phase-transition-induced large magnetic anisotropy change in VO₂/ (Co/Pt)₂ heterostructure*, Appl. Phys. Lett. 114, 012407 (2019). FIGS. 6A and 6B illustrate out-of-plane (OOP) hysteresis loops measured by magneto-optic Kerr effect (MOKE) at different temperatures. FIG. 6A shows data from a comparative sample with 3 nm Ta strain buffer layer inserted between VO₂ and perpendicular magnetic anisotropy (PMA) layers. The PMA layers comprise a Co/Pt alternating four layer stack. FIG. 6B shows data from an exemplary sample with the PMA layers located on the VO₂ layer. VO₂ exhibits a complex property change when it transforms from a monoclinic (M1) insulator into a rutile (R) metal at a critical temperature around 340 K. The magnetic anisotropy of the PMA layers changes dramatically around the critical temperature, when the PMA layers are located in contact with the VO₂ layer, as shown in FIG. 6B. In contrast, when the Ta strain buffer layer is inserted between the PMA layers and the VO₂ layer, only a small decrease in the coercive field was observed, as shown in FIG. 6A. The authors attributed this difference in the effect of the phase change of the VO₂ layer on the coercive field due to the Ta strain buffer layer in the comparative example negating the interfacial strain effect of the phase change of the VO₂ layer on the PMA layers.

According to the fourth embodiment of the present disclosure, the present inventors realized that the phase change material layer may be used as a capping layer for a ferromagnetic free layer in a STT-MRAM device. The phase change (e.g., MIT phase change) in the capping layer may modulate the PMA of the free layer to enhance the switching efficiency of the STT-MRAM device between the 0 and 1 memory states (i.e., the switching of the magnetization direction in the free layer between antiparallel and parallel to the magnetization direction of the reference layer). Specifically, the free layer 136 is located between the dielectric tunnel barrier layer 134 and the MIT capping layer 160 shown in FIGS. 8A and 8B, such that the dielectric tunnel barrier layer 134 and the MIT capping layer 160 are located on opposite major surfaces of the free layer 136.

MIT capping layer 160 may comprise and/or consist essentially of a Mott insulator material. In one embodiment, the Mott insulator material exhibits a temperature-induced metal-insulator transition in a temperature range from 30 degrees Celsius to 200 degrees Celsius. In one embodiment, the Mott insulator material comprises a material selected from V₂O₃, MnO, NiO, La₂CuO₄, LaTiO₃, Sr₂IrO₄, or NiS₂. Other MIT phase transition materials, such as VO₂ or perovskite materials, such as metal nicklates (e.g., NbNiO₃) or metal manganates (e.g., MnXO₃, where X is a transition metal) may also be used.

The phase transition of the MIT capping layer and accompanying crystal structure change induces interfacial strain when the MIT capping layer is in contact with the free layer 136. Thus, a strain-mediated modulation is provided when the MIT capping layer is provided in contact with the free layer 136. Besides this, the interfacial charge density at the interface of the free layer and the MIT capping material can also change during the MIT capping material phase transition, which may modulate the perpendicular magnetic anisotropy (PMA) of the free layer. Thus, the MIT capping material applies an interfacial strain to the free layer and/or to changes interfacial electronic states by its metal-insulator transition.

According to an aspect of the fourth embodiment, the MIT capping layer located in contact with the free layer 136, and the presence of the free layer 136 in the MTJ 140 comprises a combination of spin-transfer torque (STT) device and a phase-controlled magnetic anisotropy (PCMA) device. This combination provides an efficient magnetization manipulation, large changes in the PMA during programming, and low programming current density during operation of the magnetoresistive device. Furthermore, the phase transition time scale of MIT capping layer material (e.g., Mott material or other phase change metal oxides) can be on the order of 100 fs, which means that the MIT phase change based modulation of PMA also has great potential for ultra-fast spintronic devices.

Figure 7:
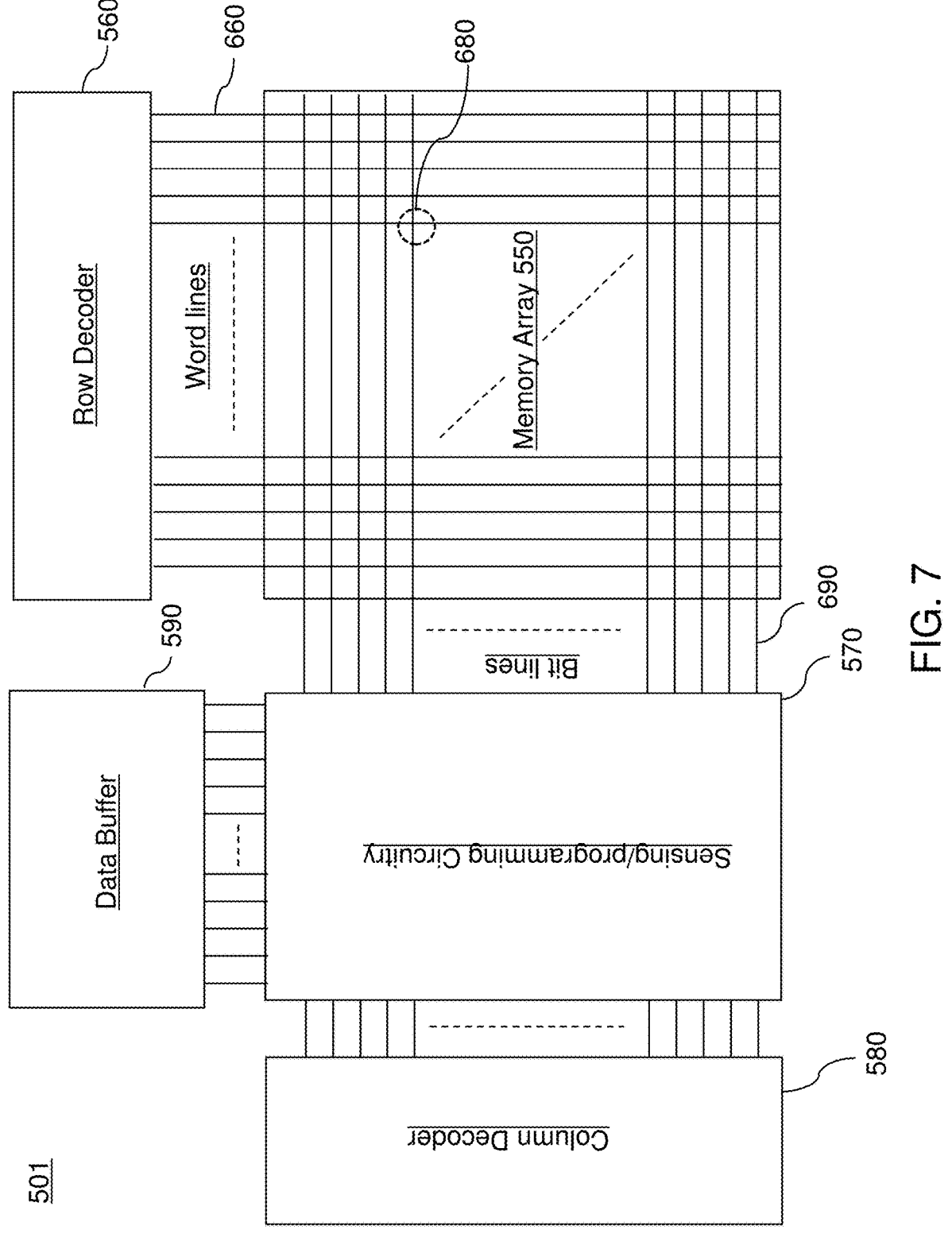
FIG. 7 is a schematic diagram of an exemplary circuit including an array of two-terminal magnetoresistive memory cells according to an embodiment of the present disclosure.

Referring to FIG. 7, a schematic diagram of an exemplary circuit is illustrated, which comprises an array of two-terminal magnetoresistive memory cells according to an embodiment of the present disclosure. The exemplary circuit illustrated in FIG. 7 may comprise a random access memory (RAM) device 501 including the memory cells 680 in an array configuration. In one embodiment, the memory cells 680 comprise two-terminal magnetoresistive memory cells each having an MTJ 140 and an MIT capping layer on the opposite side of the free layer 136 from the dielectric tunnel barrier layer 134 of the MTJ 140, described above.

The RAM device 501 includes a memory array region 550 including word lines 660 and bit lines 690. In one embodiment, a first terminal electrode of each memory cell 680 can be electrically connected to one of the bit lines 690, and a second terminal electrode of each memory cell 680 can be electrically connected to one of the word lines 660. Alternatively, a first terminal electrode of each memory cell 680 can be electrically connected to one of the word lines 660, and a second terminal electrode of each memory cell 680 can be electrically connected to one of the bit lines 690. The terms "bit line" and "word line" are arbitrary names that are assigned to various conductive lines for clarity, but should not be considered limiting.

In an illustrative example, the RAM device 501 may also contain a row decoder 560 connected to the word lines 660, and a sense amplifier circuitry and a programming circuitry connected to the bit lines 690. The sense amplifier circuitry and the programming circuitry are collectively referred to as a sensing/programming circuitry 570. A column decoder 580 and a data buffer 590 can be connected to the sensing/programming circuitry 570. A row decoder 560 can be connected to the word lines 660. Multiple instances of the memory cells 680 are provided in an array configuration that forms the RAM device 501. It should be noted that the location and interconnection of elements are schematic and the elements may be arranged in a different configuration. Further, a memory cell 680 may be manufactured as a discrete device, i.e., a single isolated device.

Each memory cell 680 includes a magnetic junction structure having at least two different resistive states depending on the direction of the programming current during a previous programming operation with the magnetic junction structure. Each memory cell 680 comprises a MIT material/ferromagnet heterostructure discussed above.

Figure 8A:
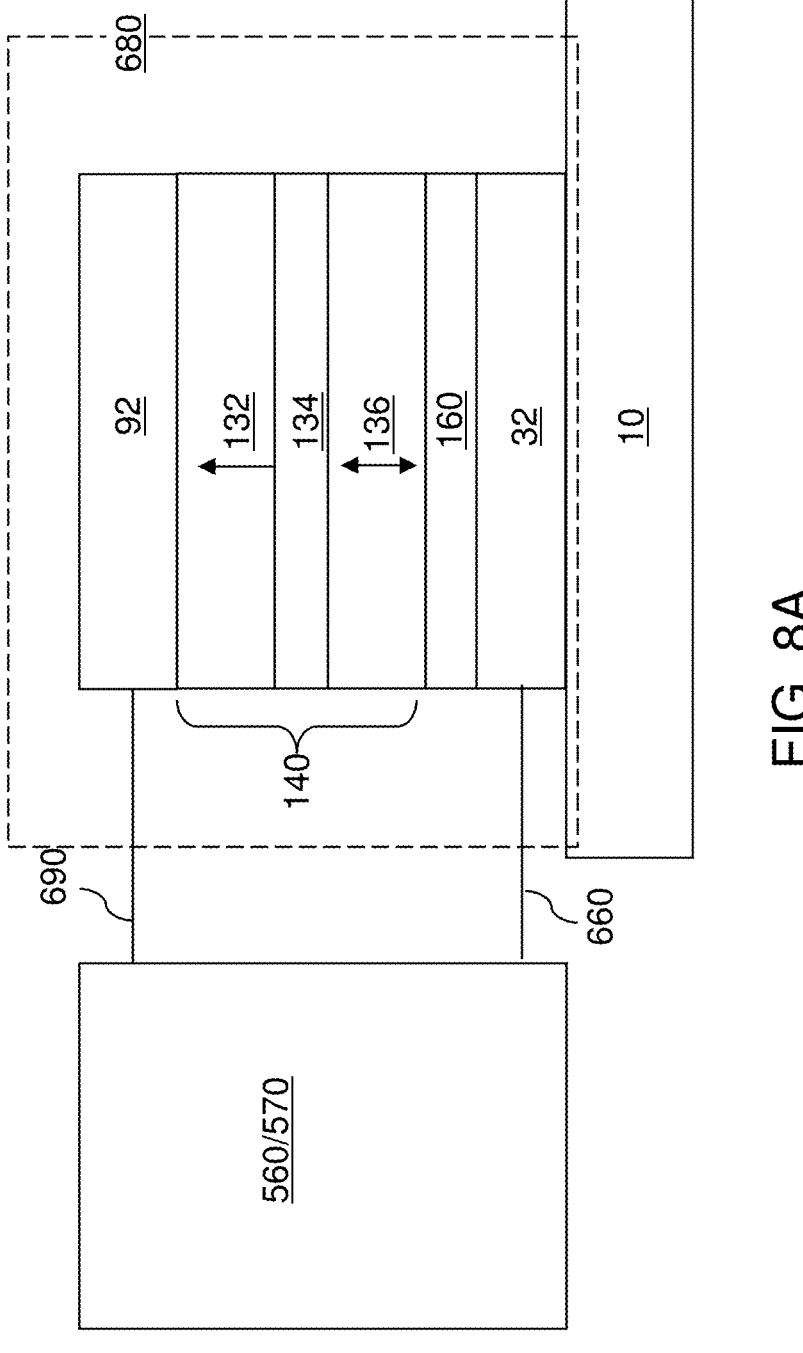
FIG. 8A illustrates a fourth exemplary magnetoresistive memory device according to a fourth embodiment of the present disclosure.
Figure 8B:
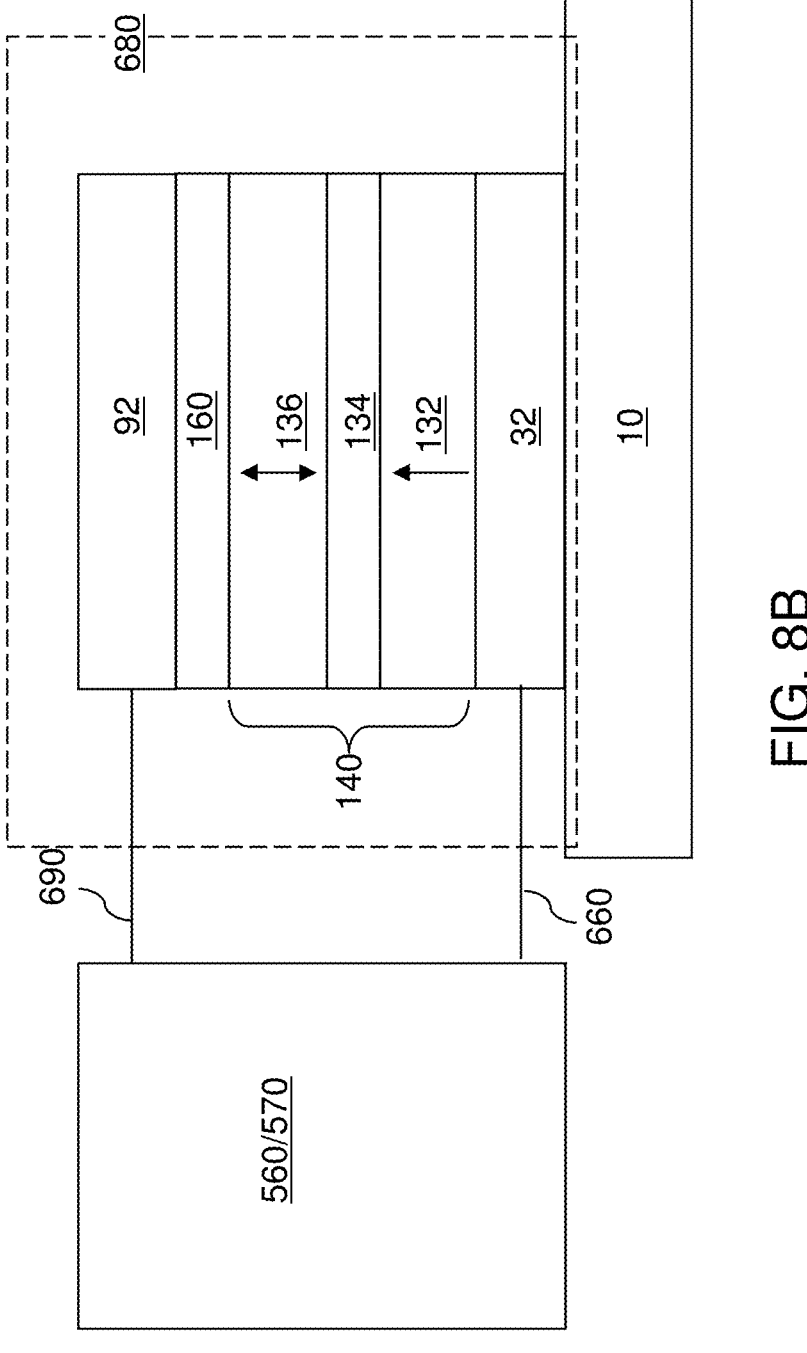
FIG. 8B illustrated an alternative configuration of the fourth exemplary magnetoresistive memory device according to the fourth embodiment of the present disclosure.

FIG. 8A illustrates a fourth exemplary magnetoresistive memory device according to a fourth embodiment of the present disclosure. FIG. 8B illustrated an alternative configuration of the fourth exemplary magnetoresistive memory device according to the fourth embodiment of the present disclosure. Each of the magnetoresistive memory cells 680 illustrated in FIGS. 8A and 8B can be incorporated into the RAM device 501 illustrated in FIG. 7 as a unit memory cell 680.

Referring collectively to FIGS. 7, 8A, and 8B, a memory device according to the fourth embodiment comprises a magnetoresistive memory cell 680 which comprises: a first terminal electrode 32; a second terminal electrode 92; and a magnetoresistive layer stack (140, 160) located between the first terminal electrode 32 and the second terminal electrode 92 and comprising, from one side to another, a reference layer 132, a dielectric tunnel barrier layer 134, a free layer 136, and a metal-insulator transition (MIT) material capping layer 160 that contacts the free layer 136 and exhibits a phase transition between an insulating state and a metal (e.g., electrically conductive) state. Generally, the second terminal electrode 92 may be more distal from a substrate 10 than the first terminal electrode 32 is from the substrate 10 as illustrated in FIG. 8A, or the first terminal electrode 32 may be more distal from the substrate 10 than the second terminal electrode 92 is from the substrate 10 as illustrated in FIG. 8B. Each of the word lines 660 and the bit lines 690 may comprise a respective metal line. Each first terminal electrode 32 may be a portion of a respective bit line 690 or a respective word line 660, or may comprise a separate metal plate in contact with the respective bit line 690 or the respective word line 660. Each second terminal electrode 92 may be a portion of a respective word line 660 or a respective bit line 690, or may comprise a separate metal plate in contact with the respective word line 660 or the respective bit line 690.

In some cases, Joule heating induced a phase transition in MIT capping layer 160 can modulate the magnetic anisotropy of the free layer 136. In one embodiment, the PMA of free layer 136 can be reduced as MIT capping layer 160 goes through the phase transition irrespective of the orientation of the magnetization in the free layer 136. By inducing spin-transfer torque through an electrical current that flows either from the first terminal electrode 32 toward the second terminal electrode 92, or from the second terminal electrode 92 toward the first terminal electrode 32, the magnetization direction of the free layer 136 can be deterministically changed between a parallel state (in which the magnetization direction of the free layer 136 is parallel to the magnetization direction of the reference layer 132) and an antiparallel state (in which the magnetization direction of the free layer 136 is antiparallel to the magnetization of the magnetization direction of the reference layer 132). In the magnetoresistive memory cell 680 of the fourth embodiment, the spin-transfer torque (STT) effect is a bidirectional effect allowing deterministic switching of the magnetization direction of the free layer 136. The phase-controlled magnetic anisotropy (PCMA) effect assists the programming of the magnetization direction of the free layer 136 by lowering the magnetic anisotropy energy barrier for switching the magnetization direction. The magnitude of the PCMA effect does not depend on the polarity of the voltage pulse applied for programming. Overall, the critical current required for switching the magnetization direction is significantly reduced irrespective of the polarities of applied voltage pulse due to lowering of the magnetic anisotropy energy barrier for flipping of the magnetization direction of the free layer 136 through the PCMA effect.

Generally, any MIT material that can provide a metal-insulator transition during operation of the magnetoresistive memory cell 680 may be used for the MIT capping layer 160. In one embodiment, a MIT material that exhibits a temperature-induced metal-insulator transition in a temperature range from 30 degrees Celsius to 200 degrees Celsius may be used for the MIT capping layer 160. In one embodiment, the MIT material in the MIT capping layer 160 may comprise an oxide material, which may be polycrystalline or single crystalline. MIT materials exhibiting phase transition near room temperature include, but are not limited to, Mott insulators, perovskite manganates (which have an $ABO_3$ structure), or nickelates (e.g., $NbNiO_3$).

In one embodiment, a magnetic anisotropy of the ferromagnetic material of the free layer 136 depends on a strain that can be controlled by MIT phase transition of the MIT capping layer 160 placed next to ferromagnetic material of the free layer 136.

The phase-transition processes of the MIT materials are usually very intense around the critical point. Thus, a strong regulation effect can be obtained with a relatively small energy input that triggers the phase transition in the MIT materials.

In one embodiment, the phase transition in the MIT capping layer 160 may be induced by various mechanism such as heating, strain modulation, electrical gating employing an additional electrode (not shown), or photonic excitations. In one embodiment, the Joule heating effect (which can induce a temperature differential on the order of 100 K per 1 V) may be employed to trigger the phase-transition controlled magnetic anisotropy modulation in the free layer 136.

In one embodiment, the MIT capping layer 160 is in direct contact with the free layer 136. The MIT capping layer 160 may be deposited by physical vapor deposition, chemical vapor deposition, and/or atomic layer deposition. The thickness of the MIT capping layer 160 may be in a range from 2 nm to 20 nm, although lesser and greater thicknesses may also be employed.

In one embodiment, the memory device comprises a programming circuit configured to apply a programming voltage pulse that is selected from: a first programming voltage pulse that applies a positive voltage to the first terminal electrode 32 relative to the second terminal electrode 92; and a second programming voltage pulse that applies a negative voltage to the first terminal electrode 32 relative to the second terminal electrode 92. In one embodiment, the positive voltage has a first magnitude that induces a first programming electrical current to flows from the first terminal electrode 32 to the second terminal electrode 92 while the MIT capping layer 160 is in an insulating state; and the negative voltage has a second magnitude that induces a second programming electrical current to flow from the second terminal electrode 92 to the first terminal electrode 32 while the MIT capping layer 160 is in the insulating state.

In one embodiment, the MIT material exhibits a temperature-induced metal-insulator transition at a transition temperature; the first programming electrical current has a first magnitude that is sufficient to heat the MIT capping layer 160 above the transition temperature; and the second programing electrical current has a second magnitude that is sufficient to heat the MIT capping layer 160 above the transition temperature. In one embodiment, the transition temperature may be in a range from 30 degrees Celsius to 200 degrees Celsius. In one embodiment, the second magnitude of the negative voltage is the same as the first magnitude of the positive voltage.

In one embodiment, the free layer 136 has a first perpendicular magnetic anisotropy having a first magnitude under a condition in which the MIT capping layer 160 is in an insulating state; and the first magnitude is large enough to achieve required thermal stability for reliable information retention. However, large current density is required to switch magnetization direction of the free layer with spin transfer torque. In one embodiment, the free layer 136 has a second perpendicular magnetic anisotropy having a second magnitude under a condition in which the MIT capping layer 160 is in a conductive state; and the second magnitude corresponds to a smaller magnetic anisotropy energy barrier that allows to decrease a current density required for a transition between a parallel alignment state and an antiparallel alignment state between the free layer 136 and the reference layer 132 during application of the first programing voltage pulse, and during application of the second programing voltage pulse.

In one embodiment, the memory device comprises a sensing circuit configured to apply a sensing voltage pulse across the magnetoresistive memory cell, wherein a magnitude of the sensing voltage pulse is insufficient to induce a phase transition in the MIT capping layer 160.

In one embodiment, the reference layer 132, the dielectric tunnel barrier layer 134, and the free layer 136 are configured to provide tunneling magnetoresistance effect; and the sensing circuit is configured to determine alignment of magnetization directions of the reference layer 132 and the free layer 136 based on a magnitude of a measured sensing current through the magnetoresistive memory cell.

In one embodiment, the free layer 136 has a magnetic anisotropy that depends on strain, while the MIT capping layer 160 may provide strain through the metal-insulator phase transition.

In one embodiment, the memory device comprises additional magnetoresistive memory cells 680 having a respective set of components that is the same as a set of components within the resistive memory cell 680. The resistive memory cell 680 and the additional magnetoresistive memory cells 680 are arranged as a two-dimensional array of magnetoresistive memory cells 680 that are accessed employed a set of word lines 660 and a set of bit lines 690; each first terminal electrode 32 of the two-dimensional array of magnetoresistive memory cells 680 comprises a portion or, or is electrically connected to, a respective word line 660 within the set of word lines 660; and each second terminal electrode 92 of the two-dimensional array of magnetoresistive memory cells 680 comprises a portion or, or is electrically connected to, a respective bit line 690 within the set of bit lines 690.

According to another aspect of the present disclosure, a method of operating the magnetoresistive memory cell 680 of the present disclosure is provided, which comprises inducing an insulator-to-metal phase transition in the MIT material by applying a programming voltage pulse across the first terminal electrode 32 and the second terminal electrode 92.

In one embodiment, the free layer 136 has a first perpendicular magnetic anisotropy having a first magnitude under a condition in which the MIT capping layer 160 is in an insulating state; and the first magnitude is large enough for required thermal stability and to store written information.

In one embodiment, the free layer 136 has a second perpendicular magnetic anisotropy having a second magnitude under a condition in which the MIT capping layer 160 is in a metal state; and the second magnitude is smaller compared to the first magnitude allowing lower current density for free layer's magnetization switching with spin-transfer torque.

The method may further comprise: applying a sensing voltage pulse across the magnetoresistive memory cell, wherein a magnitude of the sensing voltage pulse is insufficient to induce a phase transition in the MIT capping layer 160; and determining alignment of magnetization directions of the reference layer 132 and the free layer 136 based on a magnitude of a measured sensing current through the magnetoresistive memory cell.

In the magnetoresistive memory cell 680 of the fourth embodiment of the present disclosure, a combination of the STT effect and the PCMA effect reduces the switching voltages and the switching currents in both polarities, i.e., irrespective of whether the programming current flows from the first terminal electrode 32 toward the second terminal electrode 92 or from the second terminal electrode 92 toward the first terminal electrode 32.

In some embodiment, the PCMA effect may be large enough to enable use of a bulk PMA material for the free layer 136. Stability of the magnetization direction in the free layer 136 can be enhanced, while a lower switching current can be achieved through reduction of the PMA in the free layer 136 through a Joule-heating-induced phase transition in the MIT capping layer 160.

Generally, data stored in the free layer 136 may be retrieved through a tunneling magnetoresistive resistance (TMR) effect at a sensing voltage, which can be much lower than the programming voltage employed to program the free layer 136. Reduction of the thickness of the dielectric tunnel barrier layer 134 may help reduce the total electrical resistance of the magnetoresistive memory cell 680.

Generally, the magnetoresistive memory cell 680 can provide high device density, low-power operation, and higher device stability and reliability in a magnetoresistive memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising a magnetoresistive memory cell which comprises:
   a first terminal electrode;
   a second terminal electrode; and
   a magnetoresistive layer stack located between the first terminal electrode and the second terminal electrode and comprising, from one side to another, a reference layer, a dielectric tunnel barrier layer, a free layer, and a material layer having two different states of lattice deformation which have different average in-plane lattice constants and which are configured to apply different in-plane stress, wherein:
   the free layer is in direct contact with the dielectric tunnel barrier layer on one side and is in direct contact with the material layer on another side;
   the material layer comprises a metal-insulator transition (MIT) material layer that exhibits a phase transition between an insulator state and a metal state;
   the memory device further comprises a programming circuit configured to apply a programming voltage pulse between the first terminal electrode and the second terminal electrode, the programming voltage pulse inducing a programming electrical current having a magnitude sufficient to induce a Joule-heating-induced phase transition from the insulator state into the metal state in the MIT material layer and to cause a reduction in a perpendicular magnetic anisotropy of the free layer that allows a spin-transfer torque switching of the free layer while the MIT material layer is in the metal state; and
   the magnetoresistive layer stack is configured to restore the perpendicular magnetic anisotropy of the free layer to a magnitude sufficient to store written information in the free layer after the MIT material layer reverts to the insulator state upon cooling after the programming voltage pulse is turned off.

2. The memory device of claim 1, wherein the MIT material comprises $VO_2$, a Mott insulator material, or a perovskite material.

3. The memory device of claim 1, wherein:
   the free layer has a first perpendicular magnetic anisotropy having a first magnitude under a condition in which the MIT material layer is in the insulator state; and
   the first magnitude is large enough to store written information.

4. The memory device of claim 3, wherein:
   the free layer has a second perpendicular magnetic anisotropy having a second magnitude under a condition in which the MIT material layer is in a metal state; and
   the second magnitude is lower than the first magnitude.

5. The memory device of claim 1, further comprising a sensing circuit configured to apply a sensing voltage pulse across the magnetoresistive memory cell, wherein a magnitude of the sensing voltage pulse is insufficient to induce a phase transition in the MIT material layer.

6. The memory device of claim 5, wherein:
   the reference layer, the dielectric tunnel barrier layer, and the free layer are configured to provide a tunneling magnetoresistance effect; and
   the sensing circuit is configured to determine alignment of magnetization directions of the reference layer and the free layer based on a magnitude of a measured sensing current through the magnetoresistive memory cell.

7. The memory device of claim 1, wherein the free layer comprises a ferromagnetic material having a lower perpendicular magnetic anisotropy under a first condition in which the MIT material layer is in the metal state relative to a second condition in which the MIT material layer is in the insulator state.

8. The memory device of claim 1, further comprising additional magnetoresistive memory cells.

9. The memory device of claim 1, further comprising a sensing circuit configured to retrieve data stored in the free layer through a tunneling magnetoresistive resistance (TMR) effect at a sensing voltage which is lower than the programming voltage.

10. A method of operating the magnetoresistive memory cell comprising a first terminal electrode, a second terminal electrode, and a magnetoresistive layer stack located between the first terminal electrode and the second terminal electrode and comprising, from one side to another, a reference layer, a dielectric tunnel barrier layer, a free layer, and a metal-insulator transition (MIT) material layer in direct contact with the free layer, the method comprising:
   applying a programming voltage pulse between the first terminal electrode and the second terminal electrode, the programming voltage pulse inducing a programming electrical current having a magnitude sufficient to induce a Joule-heating-induced phase transition from the insulator state into the metal state in the MIT material layer and to cause a reduction in a perpendicular magnetic anisotropy of the free layer that allows a spin-transfer torque switching of the free layer while the MIT material layer is in the metal state; and
   cooling the MIT material layer to revert to the insulator state after the programming voltage pulse is turned off, thereby restoring the perpendicular magnetic anisotropy of the free layer to a magnitude sufficient to store written information in the free layer.

11. The method of claim 10, wherein the free layer has a first perpendicular magnetic anisotropy having a first magnitude under a condition in which the MIT material layer is in the insulator state; and the first magnitude is large enough to store written information.

12. The method of claim 11, wherein:

the free layer has a second perpendicular magnetic anisotropy having a second magnitude under a condition in which the MIT material layer is in a metal state; and the second magnitude is smaller than the first magnitude.

13. The method of claim 10, further comprising:

applying a sensing voltage pulse across the magnetoresistive memory cell, wherein a magnitude of the sensing voltage pulse is insufficient to induce a phase transition in the MIT material layer; and determining alignment of magnetization directions of the reference layer and the free layer based on a magnitude of a measured sensing current through the magnetoresistive memory cell.

14. The method of claim 10, wherein the programming voltage pulse comprises a first programming voltage pulse that causes electrical current flow from the first terminal electrode through the MIT material layer toward the second terminal electrode, or a second programming voltage pulse that causes electrical current flow from the second terminal electrode through the MIT material layer toward the first terminal electrode.

15. A memory device comprising a magnetoresistive memory cell which comprises:

a first terminal electrode;

a second terminal electrode;

a magnetoresistive layer stack located between the first terminal electrode and the second terminal electrode and comprising, from one side to another, a reference layer, a dielectric tunnel barrier layer, a free layer, and a metal-insulator transition (MIT) material layer that exhibits a phase transition between an insulator state and a metal state which comprise different states of lattice deformation having different average in-plane lattice constants and which are configured to apply different in-plane stress, wherein the free layer is in direct contact with the dielectric tunnel barrier layer on one side and is in direct contact with the material layer on another side;

a programming circuit configured to apply a programming voltage pulse between the first terminal electrode and the second terminal electrode, the programming voltage pulse inducing a programming electrical current having a magnitude sufficient to induce a Joule-heating-induced phase transition from the insulator state into the metal state in the MIT material layer and to cause a reduction in a perpendicular magnetic anisotropy of the free layer that allows a spin-transfer torque switching of the free layer while the MIT material layer is in the metal state; and a sensing circuit configured to apply a sensing voltage pulse across the magnetoresistive memory cell while the MIT material layer is in the insulator state, wherein a magnitude of the sensing voltage pulse is insufficient to induce a phase transition in the MIT material layer and enables retrieval of data stored in the free layer through a tunneling magnetoresistance effect, wherein the magnetoresistive layer stack is configured to restore the perpendicular magnetic anisotropy of the free layer to a magnitude sufficient to store written information in the free layer after the MIT material layer reverts to the insulator state upon cooling after the programming voltage pulse is turned off.

16. The memory device of claim 15, wherein the sensing circuit is configured to determine alignment of magnetization directions of the reference layer and the free layer based on a magnitude of a measured sensing current through the magnetoresistive memory cell.

17. The memory device of claim 15, wherein the programming circuit is configured to apply a programming voltage pulse that is selected from:

a first programming voltage pulse that applies a positive voltage to the first terminal electrode relative to the second terminal electrode; and a second programming voltage pulse that applies a negative voltage to the first terminal electrode relative to the second terminal electrode;

wherein the free layer has a first perpendicular magnetic anisotropy having a first magnitude under a condition in which the MIT material layer is in the insulator state; and the first magnitude is large enough to store written information.

18. The memory device of claim 15, wherein the programming voltage pulse is bidirectional, irrespective of whether the programming current flows from the first terminal electrode toward the second terminal electrode or from the second terminal electrode toward the first terminal electrode; and the free layer has a first perpendicular magnetic anisotropy having a first magnitude in the insulator state that is large enough to store written information, and a second perpendicular magnetic anisotropy having a second magnitude in the metal state that is lower than the first magnitude.

19. The memory device of claim 15, wherein the programming voltage pulse induces a programming electrical current having a magnitude sufficient to induce a Joule-heating-induced phase transition into the metal state in the MIT material layer and to cause a reduction in a perpendicular magnetic anisotropy of the free layer that allows a spin-transfer torque switching of the free layer while the MIT material layer is in the metal state; and the magnetoresistive layer stack is configured to restore the perpendicular magnetic anisotropy of the free layer to a magnitude sufficient to store written information in the free layer after the MIT material layer reverts to the insulator state upon cooling after the programming voltage pulse is turned off.

20. The memory device of claim 15, wherein:

the free layer has a first perpendicular magnetic anisotropy having a first magnitude under a condition in which the MIT material layer is in the insulator state; and the first magnitude is large enough to store written information;

the free layer has a second perpendicular magnetic anisotropy having a second magnitude under a condition in which the MIT material layer is in the metal state; and the second magnitude is lower than the first magnitude.

* * * * *